(12) United States Patent
Oishi et al.

(10) Patent No.: US 6,315,467 B1
(45) Date of Patent: Nov. 13, 2001

(54) MATERIAL HAVING PHOTOSENSITIVE RESIN COMPOSITION, METHOD FOR DEVELOPING LITHOGRAPHIC PRINTING PLATE PRECURSOR, AND DEVELOPMENT PROCESSING APPARATUS

(75) Inventors: Chikashi Oishi; Hiroyuki Sasayama; Takashi Nakamura; Shuichi Takamiya, all of Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/527,220

(22) Filed: Mar. 16, 2000

(30) Foreign Application Priority Data

Mar. 18, 1999 (JP) .................................................. 11-074131
Jun. 9, 1999 (JP) .................................................. 11-162657

(51) Int. Cl.[7] ...................................................... G03D 3/02
(52) U.S. Cl. .......................... 396/578; 396/626; 396/611
(58) Field of Search ..................................... 396/567–570, 396/578, 626; 430/393, 398–400; 204/104–111, 182.3; 134/64 P, 64 R, 122 P, 122 R

(56) References Cited

U.S. PATENT DOCUMENTS 5,355,191 * 10/1994 Nakamura et al. ................... 396/626
5,424,799 *  6/1995 Nakamura et al. ................... 396/626
5,930,547 *  7/1999 Stein et al. ........................... 396/578

FOREIGN PATENT DOCUMENTS 0 556 690 A1   8/1993  (EP) .
0 767 410 A2   4/1997  (EP) .
0 864 922 A1   9/1998  (EP) .

OTHER PUBLICATIONS

Patent Abstract of Japan, 61110142, May 28, 1986.
Patent Abstract of Japan, 61061164, Mar. 28, 1986.
European Search Report.

* cited by examiner

Primary Examiner—D Rutledge
(74) Attorney, Agent, or Firm—Sughrue, Mion, Zinn, Macpeak & Seas, PLLC

(57) ABSTRACT

A method for developing a material having a photosensitive resin composition or a photosensitive lithographic printing original plate is disclosed, comprising developing a material having a plurality of photosensitive resin composition sheets in sequence with a developer or developing a photosensitive lithographic printing plate precursor with an alkaline developer, wherein the activity of developer is maintained by detecting the exhaustion of developer occurring with the development and passing a current between two electrodes through a developer according to the degree of exhaustion detected. Also disclosed is a development processing apparatus for use in the development of the material having a photosensitive resin composition or the photosensitive lithographic printing plate precursor

16 Claims, 5 Drawing Sheets

MATERIAL HAVING PHOTOSENSITIVE RESIN COMPOSITION, METHOD FOR DEVELOPING LITHOGRAPHIC PRINTING PLATE PRECURSOR, AND DEVELOPMENT PROCESSING APPARATUS

FIELD OF THE INVENTION

The present invention relates to a method and an apparatus for developing a photosensitive resin composition supported on a substrate used in the production of a lithographic printing plate, a printed wiring substrate or an integrated circuit. In particular, the present invention relates to a developing method and a development processing apparatus, where a material having a plurality of photosensitive resin composition sheets can be stably processed using an automatic developing machine. More specifically, the present invention relates to a developing method and a development processing apparatus, where a lithographic printing plate precursor such as PS plate can be stably developed in the plate-making process.

Furthermore, the present invention relates to a plate-making method of a heat mode-type photosensitive image recording material which can be used as an offset printing master. In particular, the present invention relates to a plate-making method of a lithographic printing plate having a photosensitive layer comprising an infrared laser use positive photosensitive composition, which can be used in the so-called direct plate-making process of directly producing a printing plate based on digital signals of a computer or the like.

BACKGROUND OF THE INVENTION

In the production of a lithographic printing plate precursor, a printed wiring substrate or an integrated circuit, such as photosensitive lithographic printing plate (hereinafter sometimes simply referred to as "PS plate"), the step of developing a layer of a material having a photosensitive resin composition provided on a substrate generally proceeds in such a manner that a part of the photosensitive resin composition of a printing plate precursor including a photosensitive lithographic printing plate precursor dissolves out into an alkali developer and thereby the development is performed. Therefore, the alkaline developer in the development tank diminishes in the activity due to the consumption of the alkali agent component. Even at the dead time where the development of the printing plate precursor or the like is not performed, the surface of the developer is always contacting with air and the developer absorbs carbon dioxide gas in air, as a result, the alkali agent component contained in the developer is consumed and the activity similarly decreases. In other words, the processing exhaustion occurring with the development of a photosensitive resin composition of a printing plate precursor or the like and the aging deterioration (or aging exhaustion) caused by the contacting of the developer with air simultaneously proceed more or less in the development processing apparatus. If the deterioration proceeds over a certain level, the development cannot be properly performed, therefore, a method of performing the development while preventing the deterioration by appropriately supplying a development replenisher is usually used.

For preventing the developer from diminishing in the activity, a method of supplying a replenisher containing an alkali agent or a buffer in a higher concentration than the developer in the development tank and thereby compensating the alkali consumption is usually used. This replenishing method is necessary for stably developing a large amount of a light-sensitive resin composition using a development processing apparatus but this method has the following problems.

1) Along with the replenishment, an overflow is discharged from the development tank and works out to a development waste solution which cannot be exhausted into sewage, therefore, means for treating the waste solution is necessary. The treatment of waste solution costs high and the treatment itself has an impact on the environment.
2) In addition to the above-described problem, the replenishment is accompanied by useless discharge of the developer components such as alkali agent and this imposes a burden in view of profitability.
3) The photosensitive resin composition dissolved out into the developer precipitates in the developer having a high salt concentration and adheres to the transportation system such as roller to cause abnormal transferability in the development processing apparatus or stopping of the development processing apparatus. Furthermore, the development processing apparatus is stopped at the time of removing the precipitate by cleaning the apparatus, therefore, the productivity decreases and additional labors and times are necessary for the cleaning operation.
4) The chemicals added as an alkali agent or a buffer (e.g., silicate, phosphate) increase the salt concentration and the components dissolved out from the photosensitive resin composition readily precipitate in the transportation system or a tank (particularly in the case of silicate).

For overcoming the problems 1) and 2) above, it may be considered to add only necessary components and thereby reduce the loss by the overflow. For adding only the necessary components, a method of adding the components consumed directly to the developer on use may be thought out. Although the problems 1) and 2) may be solved to a certain extent by this method, the problems in the replenishment cannot be substantially solved, because the dissolution of developer takes a time to cause troubles and in the case of problems 3) and 4), the problems are more intensified.

A technique of dipping an inactive electrode in an aqueous solution of neutral salt and causing electrolysis of water to generate hydrogen ion in the anode and hydroxy ion in the cathode is well known. The electrolysis of water does not elevate the salt concentration, therefore, this seems to be more preferred as a means for overcoming the problems 1) and 2). Actually, it is known to use the hydroxy ion generated in the cathode for increasing the pH of a developer used in the processing of a silver halide photographic material.

However, feeding of an alkali agent utilizing the electrolysis is generally not used in the development of a material having a photosensitive resin composition, such as a photosensitive material for printing, where photolysis of quinonediazide or diazo coupling of a diazonium salt is used. This seems to be ascribable to the following reasons. Although it is called a developer, the developer for materials having a photosensitive resin composition is fundamentally different in the composition from the developer for silver halide light-sensitive materials. The developer for materials having a photosensitive resin composition contains organic polymer components water-solubilized and dissolved out from the photosensitive resin composition or contains siloxane-based resin components dissolved out from the aluminum printing plate precursor, therefore, poisoning of the electrode, namely, organic contamination is caused.

Then, it is duty expected that the electrolysis operation cannot be stably continued.

U.S. Pat. No. 2,541,488 discloses a diazo image formation method of forming a dye by the diazo coupling reaction using hydroxy ion generated on the electrolysis. Differently from the developer, this method is realized in a newly prepared reaction system not having organic and inorganic resin components and free of a fear for poisoning. This system is different from the photosensitive resin composition as an object of the present invention.

The development of a material having a photosensitive resin composition accompanied with replenishment has another problem that when the replenishment is controlled using the pH as usual, high precision of replenishment cannot be satisfactorily maintained. The developer for materials having a photosensitive resin composition is designed to maintain a low salt concentration and a high pH in practice so as to accelerate the dissolving out of unnecessary composition components. Accordingly, generation of even a slight amount of hydroxy ion or hydrogen ion in the developer affects the performance of the developer. Nevertheless, due to the high pH of developer, the pH insensibly responds to the fluctuation in the alkali component concentration. Therefore, the pH value used for the control must be strictly set with respect to the tolerance width and a technique of replenishing a large amount of developer to inhibit the fluctuation of pH and thereby maintain stable development performance has been heretofore employed. This high replenishing ratio also contributes to the prevention of precipitation of the photosensitive resin composition components dissolved out. In other words, the prevention of exhaustion of the developer or the prevention of production of precipitates runs counter to the reduction in the amount of development replenisher or waste solution. The demand for a technique capable of realizing these two items at the same time is strong but not yet satisfied.

On the other hand, a system of performing the plate-making directly from the digital data of a computer without any intervention of a lith film is attracting attention in recent years. The development of lasers is recently remarkable and in particular, with respect to solid lasers and semiconductor lasers having a light emitting region in the region of from near infrared to infrared, a high output and compact product can be easily available. As a light source for exposure in the system of performing the plate-making directly from the digital data of the product, the above-described lasers are very useful.

An image recording material suitable for the laser writing is used as a photosensitive printing plate precursor for use in that system. With respect to the printing plate precursor for use in that system, JP-A-7-285275 (the term "JP-A" as used herein means an "unexamined published Japanese application") proposes a positive image recording material containing a binder such as cresol resin, a substance capable of absorbing light and thereby generating heat, and a substance which is thermally decomposable and in the non-decomposed state, substantially reduces the solubility of the binder, such as quinonediazide. In this recording material, the substance capable of absorbing light and thereby generating heat causes heat generation in the exposed area upon exposure by an infrared ray laser, so that solubility of the exposed area can be obtained.

In the photosensitive lithographic printing original plate capable of direct plate-making in a heat mode, the problems in the environmental issue, profitability, maintenance of quality or working operation come out as a large defect at the time of performing the development processing. More specifically, the heat-mode printing plate is small in the discrimination by the exposure, therefore, readily affected even by a fluctuation factor on a level of causing no problem in conventional techniques. One example is the deterioration in the developability during the storage aging. In the printing plate precursor of this type, when stored for a long period time, the developability of the photosensitive layer is gradually deteriorated and a serious difference is caused in the developability between the time immediately after the coating and the time after the storage aging. This difference brings about fluctuation in the finished quality of development, namely, fluctuation in the quality of printing plate.

SUMMARY OF THE INVENTION

One object of the present invention is to provide a development processing method comprising continuously or intermittently developing a material having a photosensitive resin composition while maintaining the performance of the developer in the developing tank by the replenishment using a development processing solution, in which the problems described above can be overcome, the amount of the development replenisher, the replenishing agent or development waste solution can be reduced, and stable development quality can be constantly obtained. More specifically, the object is to provide a method for developing a material having a photosensitive resin composition using a development processing apparatus, in which the dissolved components are not precipitated even with a small replenishing amount, the amount of waste solution discharged can be reduced, and the development quality can be stably maintained without causing any impairment.

Another object of the present invention is to provide a development processing method capable of performing the plate-making in a heat mode directly from the digital information of a computer or the like, which is free of any effect by the change in aging during the storage of the lithographic printing plate precursor (hereinafter, sometimes, called "lithographic printing original plate") and mostly free of the effect by the fluctuation in the development conditions within a day or over days and can stably manufacture a printing plate.

Still another object of the present invention is to provide a development processing apparatus suitable for the above-described lithographic printing plate precursor, in which the developability can be maintained for a long period of time.

The present inventors have made investigations for satisfying both of the requirement for a small amount of waste solution discharged with a small replenishing amount and the requirement for high development quality with stable operation, by studying whether any effect is provided on the activation of exhausted developer when a current is passed through the developer, then, a fundamental prospect is gained. However, it is considered that even if this method is possible, a problem remains in practice, that is, stable control and maintenance of the pH value. Therefore, extensive investigations have made to find out proper control means, as a result, it is unexpectedly found that the objects can be obtained by selecting an appropriate index for the degree of exhaustion of the developer and controlling the replenishing rate in correspondence with the fluctuation in the index, without controlling the replenishment by monitoring the pH value. The present invention has been accomplished based on this finding.

Furthermore, the present inventors have made extensive investigations on the means for reducing the fluctuation in the development performance due to aging of the original plate (i.e., the printing plate precursor) or working conditions and stably maintaining the performance of developer, which can be used in the development processing of a photosensitive lithographic printing original plate capable of direct print-making in a heat mode. As a result, when hydroxy ion generated by the electrolysis of water is used, the activity of the developer can be stably maintained in high precision, the deterioration in the developability during the storage aging of the printing original plate (i.e., the printing plate precursor) does not come out in any form, and the storage stability of the developability can be improved The present invention has been accomplished also based on this finding.

The embodiments and preferred embodiments of the present invention are described below.

1. A method for developing a material having a photosensitive resin composition, the method comprising developing a material having a plurality of photosensitive resin composition sheets in sequence with a developer, wherein the activity of developer is maintained by detecting the exhaustion of developer occurring with the development of the photosensitive resin composition and passing a current between two electrodes through a developer according to the degree of exhaustion detected.

2. The method for developing a material having a photosensitive resin composition as described in 1 above, the method comprising developing a material having a plurality of photosensitive resin composition sheets, wherein the activity of developer is maintained using a development processing. apparatus comprising development means for processing the photosensitive resin composition with a developer, detection means for detecting the exhaustion of developer occurring with the development, means for passing a current between two electrodes through a developer and supply means for supplying hydroxy ion generated to the developer, by sequentially developing a plurality of photosensitive resin composition sheets with a developer, detecting the exhaustion of developer occurring with the development, and supplying hydroxy ion generated due to working of the means for passing a current, to the developer according to the degree of exhaustion detected.

3. The method for developing a material having a photosensitive resin composition as described in 1 or 2 above, wherein the means for detecting the exhaustion of developer occurring with the development is at least one selected from the following three means:

(1) reading of the processed area of the material having a photosensitive resin composition, (2) integration of intervals where the development of the material having a photosensitive resin composition is not performed in the development processing apparatus, and (3) measurement of the electric conductivity (hereinafter simply referred to as electroconductivity), specific gravity or opacity of the developer stored in the development processing apparatus.

4. The method for developing a material having a photosensitive resin composition as described in any one of 1 to 3 above, wherein the exhaustion of developer occurring with the development is determined by combining (1) the reading of the processed area of the material having a photosensitive resin composition and (2) the integration of intervals where the development of the material having a photosensitive resin composition is not performed in the development processing apparatus.

5. The method for developing a material having a photosensitive resin composition as described in any one of 1 to 4 above, wherein the development tank and the tank for passing a current between two electrodes through the developer are connected to each other by piping to constitute a circulatory system and the developer exhausted along with the development is reused after activating it by passing a current.

6. The method for developing a material having a photosensitive resin composition as described in any one of 1 to 5 above, wherein the developer is an alkaline aqueous solution having a pH of 12.0 or more.

7. The method for developing a material having a photosensitive resin composition as described in any one of 1 to 6 above, wherein. the washing water used for the washing or stopping step subsequent to the development step is contacting with the anode and at the same time electrically contacting with the developer through a diaphragm.

8. The method for developing a material having a photosensitive resin composition as described in any one of 1 to 7 above, wherein the diaphragm partitioning respective electrode chambers of two electrodes is a divalent selective anion exchange membrane.

9. A development processing apparatus for a material having a photosensitive resin composition, comprising development means for sequentially processing a material having a photosensitive resin composition with a developer, detection means for detecting the exhaustion of developer occurring with the development or the aging of developer, current-carrying means for passing a current between two electrodes through a developer to generate hydroxy ion, and circulation means for connecting the development means and the current-carrying means.

10. A method for developing a photosensitive lithographic printing plate precursor (i.e., the photosensitive lithographic printing original plate), comprising developing a lithographic printing plate precursor with an alkaline developer, the lithographic printing plate precursor comprising a support having thereon a photosensitive layer formed by coating an infrared laser use positive photosensitive composition containing at least (A) an alkali-soluble polymer compound, (B) a compound which compatibilizes with the alkali-soluble polymer compound to reduce the solubility of the polymer compound in an alkali aqueous solution and diminish the action of reducing the solubility on heating and (C) a compound which absorbs light and thereby generates heat, wherein the activity of the developer is maintained by passing a current between electrodes of current-carrying means appending to development means and having a cathode chamber, an anode chamber and electrodes, through the developer in the cathode chamber.

11. The method for developing a photosensitive lithographic printing plate precursor as described in 10 above, wherein the photosensitive lithographic printing plate precursor is a lithographic printing plate precursor having a photosensitive layer containing, in addition to the constituent components (A), (B) and (C), (D) a cyclic acid anhydride represented by the following formula (I):

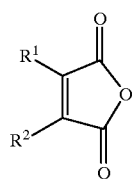

(I)

wherein $R^1$ and $R^2$ each independently represents hydrogen atom or an alkyl, alkenyl, alkoxy, cycloalkyl, aryl, carbonyl, carboxy or carboxylic acid ester group having from 1 to 12 carbon atoms, which may have a substituent, and $R^1$ and $R^2$ may be combined with each other to form a ring structure.

12. The method for developing a photosensitive lithographic printing plate precursor as described in 10 or 11 above, wherein the activity of developer is maintained by controlling the quantity of current passed between electrodes through the developer in the cathode chamber according to the degree of exhaustion of the developer occurring with the development and thereby controlling the production of hydroxy ion supplied to the developer.

13. The method for developing a photosensitive lithographic printing plate precursor as described in any one of 10 to 12 above, wherein the means for detecting the exhaustion of developer occurring with the development is at least one selected from the following three means:

(1) reading of the processed area of the photosensitive lithographic printing plate precursor, (2) integration of intervals where the development of the photosensitive lithographic printing plate precursor is not performed in the development processing apparatus, and (3) measurement of the electric conductivity (hereinafter simply referred to as electroconductivity), specific gravity or opacity of the developer stored in the development processing apparatus.

14. The method for developing a photosensitive lithographic printing plate precursor as described in any one of 10 to 13 above, wherein the anode solution taken out from the anode chamber of the current-carrying means forms a part or the whole of the washing water used for the washing or stopping step subsequent to the development step.

15. A development processing apparatus for photosensitive lithographic printing plate precursors, comprising:

development means for developing a photosensitive lithographic printing plate precursor, detection means for detecting the exhaustion of developer occurring with the development or the aging of developer, current-carrying means appending to the development means and having a cathode chamber and an anode chamber, for passing a current between electrodes through the developer in the cathode chamber to generate hydroxy ion, and liquid transfer means (hereinafter, sometimes, called circulation means) for connecting the development means and the current-carrying means.

16. A development processing apparatus for photosensitive lithographic printing plate precursors, comprising:

development means for developing a photosensitive lithographic printing plate precursor, washing or stopping means for stopping or washing the printing plate precursor delivered from the development step, detection means for detecting the exhaustion of developer occurring with the development or the aging of developer, current-carrying means appending to the development means and having a cathode chamber and an anode chamber, for passing a current between electrodes through the developer in the cathode chamber to generate hydroxy ion in the cathode chamber and at the same time generate hydrogen ion in the anode chamber, liquid transfer means for connecting the development means and the current-carrying means, and liquid transfer means for connecting the washing or stopping means and the current-carrying means The present invention is characterized by the use of detection means in place of the pH value for detecting the exhaustion of developer occurring with the development, differently from the developing method (e.g., in an activator processing) using means for generating electrolysis of alkali components known in the field of silver halide photographic light-sensitive materials. The developer of silver salt light-sensitive materials is sufficient in the buffering ability and scarcely undergoes irregular changes of pH not participating in the exhaustion of developer, therefore, it is sufficient to adjust the pH to the standard value. However, in the developer for materials having a photosensitive resin composition, the pH readily undergoes changes having no correspondence to the photographic performance and the pH insensibly responds to the change in the amounts of alkali components ascribable to the development. Therefore, it is not suitable to control the amount of alkali supplied by the pH value, but another detection means capable of correctly reflecting the exhaustion and not relying on the pH is necessary. The present invention has been accomplished by finding out such detection means.

The preferred detection means for detecting the exhaustion of developer, which is a main feature of the present invention, includes the following three means.

(1) Reading of Processed Area of Material Having Photosensitive Resin Composition For example, in the case of a positive photosensitive material, the o-quinonediazide as a photoreceptor is converted into a carboxylic acid upon sensitization and dissolves in the developer to consume the alkali. In the developer system poor in the buffering ability, the relationship between the alkali consumption and the pH change is not simply fixed, whereas the amount of photosensitive material processed corresponds to the amount of alkali agent consumed and moreover, serves as an index capable of exact reading. Therefore, by using the amount of photosensitive material processed as an index, the degree of exhaustion of the developer can be exactly detected.

(2) Integrated Value of Intervals where Development is not Performed in Development Processing Apparatus The developer for materials having a photosensitive resin composition usually has high alkalinity such that the pH is 12 or more, mostly 12.5 or more, and at the same time, has low salts concentration, therefore, the developer absorbs carbon dioxide gas in air at a high rate. In acute correspondence to the amount of carbon dioxide gas absorbed, the development activity decreases. Accordingly, in proportion to the interval where the development is not performed in the development processing apparatus, the aging deterioration of developer due to the carbon dioxide gas proceeds. Under these circumstances, combined with the low salts concentration and high hydroxy ion concentration of the developer, the pH value cannot serve as an index for the aging deterioration ascribable to the absorption of carbon dioxide gas but the integrated time of intervals where the development is not performed can serve as an index for controlling the amount of alkali supplied, namely, means for appropriately detecting the exhaustion. The term "interval where the development is not performed" as used herein means a sum of two cases; one is in the state where the power source of the development processing apparatus is turned on, the temperature and the replenishing system are ready and the development can start on feeding of a material having a photosensitive resin composition, namely, a so-called stand-by state, and another is in the dead state where the power source of the development processing apparatus is turned off. The carbon dioxide gas absorbing rate does not differ so largely between the stand-bay state and the dead state where neither the temperature control nor the stirring of developer is done, therefore, even when intervals of two cases are integrated while neglecting the slight difference therebetween, the precision in the control of developer is not greatly affected. If the difference between the stand-by state and the dead state can not be neglected, the correction may be carried out according to each the absorbing rate. The correction may be conducted by calculating the average value or by calculating a replenishing amount every the integrated times.

On the other hand, the degree of exhaustion of the developer occurring with the development is detected by the method in (1) above and the degree of exhaustion of the developer occurring with development and aging (stand-by and dead of apparatus) is detected by the method (3) described below.

(3) Detection of Degree of Exhaustion by Physical Property Value Other than pH Value As the physical detection means, physical property values other than pH value can be used. In the developer for materials having a photosensitive resin composition, the alkali component is consumed by the development and this must appear as the decrease of hydroxy ion, namely, pH, the decrease of electric conductivity, the increase of specific gravity and the increase of opacity. However, as repeatedly described above, the pH value does not correctly reflect the exhaustion of developer due to various combined factors, whereas physical property values other than pH respond in correspondence to the exhaustion and can be used as the means for detecting the degree of exhaustion. The physical property values preferably used to this purpose are electric conductivity (hereinafter referred to as "electroconductivity"), specific gravity and opacity. Among these, the electroconductivity unexpectedly well reflects the exhaustion. The conditions of high alkali concentration and low salts concentration seem to be advantageous for the detection means because the hydroxy ion can greatly contributes to the electroconductivity and the concentration thereof nearly corresponds to the electroconductivity.

The exhaustion of developer is brought about by both the processing exhaustion occurring with the processing of a material having a photosensitive composition and the aging exhaustion due to absorption of carbon dioxide gas in the environment in the state where the development is not performed. Therefore, by determining the degree of exhaustion using in combination the processed area of a material having a photosensitive resin composition and the integrated time of aging intervals in the state where the development is not performed, including the stand-by state, the precision in the feeding of alkali can be more improved.

As the electrolytic solution used for passing a current and thereby feeding alkali, an aqueous solution of salts may be prepared separately from the developer. However, at least with respect to the cathode solution, use of the developer actually used is particularly advantageous because the preparation of electrolytic solution is not necessary (or the amount of the electrolytic solution can be greatly reduced) and since the current-carrying tank can be directly connected to the developer bath, the solution may be used in circulation by introducing the exhausted developer into the current-carrying tank and activating the developer in the current-carrying tank. In this development processing method, the amount of developer discharged as the waste solution after the use in the development can be greatly reduced within the range of not causing precipitation of organic materials (e.g., polymer compound) dissolved out in the developer.

During the passing of a current (i.e., during the carrying of a current, hydroxy ion is generated in the cathode chamber and the developer is activated. At the same time, in the anode chamber, hydrogen ion is produced and this hydrogen ion can also be used in the development. More specifically, as described later, the hydrogen ion may be used for accelerating the water washing in the water washing step subsequent to the development of a material having a photosensitive resin composition or may be used for the neutralization operation as a preparatory treatment before the discharge of the developer waste solution.

The above-described problems relating to the stability in the development of a material having a photosensitive resin composition can be solved by the present invention as follows:

(1) the amounts of chemicals used as the developer components can be reduced and the amount of waste solution discharged can be reduced;

(2) the feeding of alkali can be controlled by a proper index, the development quality can be maintained and the operation can be stably performed while preventing the dissolved components from precipitating in the developer circulating system; and (3) in the case where the anode solution is used for the replenisher in the water washing, particularly water washing by low replenishment, the relief image in the non-dissolving out region can be increased in the strength.

With respect to the above-described organic contamination, namely, poisoning of electrodes, the method of the present invention can be free of any deterioration in the electrolytic efficiency due to poisoning. This unexpected effect is considered to result because the developer in the developing tank is stabilized in the method of the present invention where the feeding of alkali is controlled by a proper index.

The advantageous points and characteristic features of the present invention are further described below.

Figure 1:
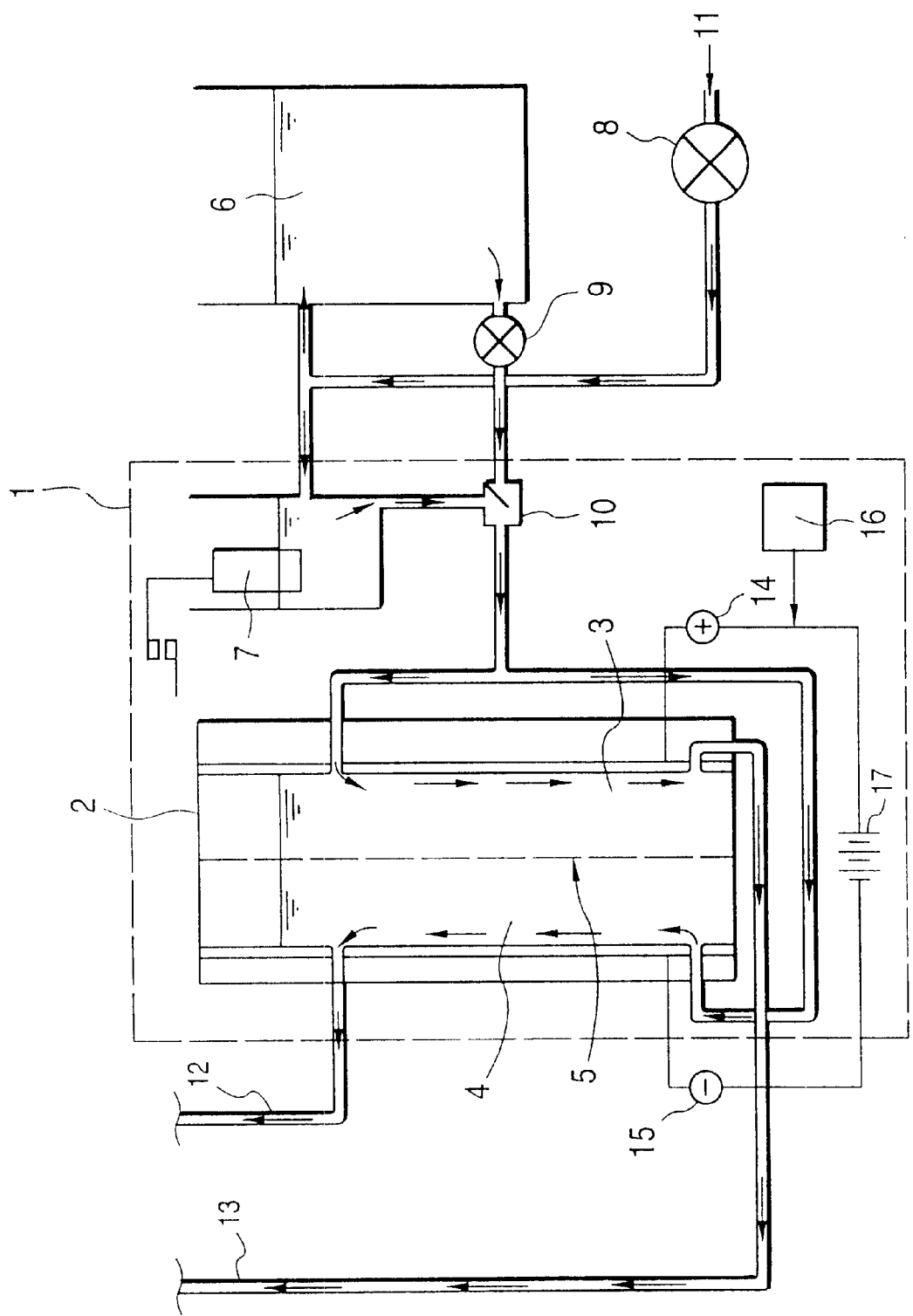
FIG. 1 is a schematic view showing the structure of a device for electrolyzing water according to the present invention.

1 electrolytic device
2 electrolytic cell
3 anode chamber
4 cathode chamber
5 diaphragm
6 solution preparing tank
7 level sensor
8 valve
9 valve
10 changeover cock
11 water
12 anode solution transfer line
13 cathode solution transfer line
14 anode
15 cathode
16 control part
17 power source unit
21 processing web
22 developer applying part
23 developer applying part jacket
24 applicator roller
25 washing.stopping solution applying part
26 washing.stopping solution applying jacket
27 applicator roller
28 developer applying contact point
29 washing.stopping solution applying contact point
33 developing tank
34 liquid cover
35 washing.stopping tank
36 liquid cover
37, 37' slit inlet, outlet
38, 38' transportation route
39 changeover cock
40 circulating pump
41 circulation route
42 circulation route
43 control part
44 electrolytic cell
45 discharge port
A, A' transportation route of photosensitive lithograhic printing plate precursor
50 circulating pump
51 liquid transfer line
52 liquid transfer line
53 development processing apparatus
54 developing tank

DETAILED DESCRIPTION OF THE INVENTION

The method for developing a material having a photosensitive resin composition according to the present invention is described in detail below.

[Development]

The development processing solution (hereinafter referred to as "developer") to which the developing method of the present invention can be applied includes commercially available general-purpose developers. That is, the developing method of the present invention can be used in the development of various materials having a photosensitive resin composition, namely, a photosensitive material for lithographic printing, a photosensitive material for printed wiring substrates or a photoresist for forming a high definition (i.e., high accurate) pattern of an integrated circuit or the like. The developing method of the present invention is preferably used in the development of a photosensitive material for lithographic printing, more preferably in the development of a PS plate, particularly, a positive photosensitive resin composition.

The developer for use in the development of those materials having a photosensitive resin composition is first described below.

<Developer>

In the present invention, the developer for use in the development of a material having a photosensitive resin composition is preferably a developer having a pH of from 9.0 to 14.0, more preferably from 12.0 to 13.5. Unless otherwise indicated, the developer referred to in the present specification means both the development initiating solution (developer in a narrow meaning) and the development replenisher.

As the developer for use in this development, a conventionally well-known alkali aqueous solution may be used. Examples thereof include inorganic alkali agents such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide and lithium hydroxide; and organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine.

These alkali agents are used individually or in combination of two or more thereof.

Among the above-described alkali aqueous solutions, the developer capable of more successfully bringing out the effect of the present invention is an aqueous solution containing preferably an alkali metal silicate and having a pH of 12 or more. The aqueous solution of alkali metal silicate can be controlled in the developability by the ratio of silicone oxide $SiO_2$ as a component of the silicate to the alkali metal oxide $M_2O$ (the ratio is generally expressed by the molar ratio of $[SiO_2]/[M_2O]$), and the concentrations thereof. For example, an aqueous solution of sodium silicate having an $SiO_2/Na_2O$ molar ratio of from 1.0 to 1.5 (namely, $[SiO_2]/[Na_2O]$ is from 1.0 to 1.5) and having an $SiO_2$ content of from 1 to 4 wt % disclosed in JP-A-54-62004, and an aqueous solution of alkali metal silicate having an $SiO_2/M$ molar ratio of from 0.5 to 0.75 (namely, $[SiO_2]/[M_2O]$ is from 1.0 to 1.5), having an $SiO_2$ concentration of from 1 to 4 wt % and containing at least 2% of potassium based on the gram atom of all alkali metals present in the developer described in JP-B-57-7427 (the term "JP-B" as used herein means an "examined Japanese patent publication") may be suitably used.

The developer may contain, if desired, various surface active agents and organic solvents for the purpose of enhancing the developability, dispersing the development residue or increasing the ink receptivity on the image area of a printing plate. Preferred examples of the surface active agent include anionic, cationic, nonionic and amphoteric surface active agents.

These surface active agents may be used individually or in combination of two or more thereof. The surface active agent is added to the developer in an amount of from 0.001 to 10 wt %, more preferably from 0.01 to 5 wt %.

The developer may further contain an organic solvent. The solvent used here suitably has a solubility in water of about 10 wt % or less, preferably 5 wt % or less. Examples thereof include 1-phenylethanol, 2-phenylethanol, 3-phenyl-1-propanol, 4-phenyl-1-butanol, 4-phenyl-2-butanol, 2-phenyl-1-butanol, 2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 3-methylcyclohexanol, 4-methylcyclohexanol, N-phenylethanolamine and N-phenyldiethanolamine. The organic solvent content is from 0.1 to 5 wt % based on the total weight of the solution used. The amount of the organic solvent used has a close relation to the amount of the surface active agent used. As the amount of organic solvent increases, the amount of the surface active gent is preferably increased. This is because if the amount of surface active agent is small and the organic solvent is used in a large amount, the organic solvent does not completely dissolve and good developability cannot be ensured.

Furthermore, the developer may contain, if desired, an antiseptic, a coloring agent, a thickener, a defoaming agent and a hard water-softening agent. Examples of the hard water-softening agent include polyphosphoric acid, sodium, potassium and ammonium salts of polyphosphoric acid, ethylenediaminetetraacetic acid, diethylenetriaminepentaacetic acid, triethylenetetraminehexaacetic acid, hydroxyethylethylenediaminetriacetic acid, nitrilotriacetic acid, aminopolycarboxylic acid such as 1,2-diaminocyclohexanetetraacetic acid and 1,3-diamino-2-propanoltetraacetic acid, sodium, potassium and ammonium salts of the aminopolycarboxylic acid, aminotri (methylenephosphonic acid), ethylenediaminetetra (methylenephosphonic acid), diethylenetriaminepenta (methylenephosphonic acid), triethylenetetraminehexa (methylenephosphonic acid), hydroxyethylethylenediaminetri(methylenephosphonic acid), 1-hydroxyethane-1,1-diphosphonic acid, and sodium, potassium and ammonium salts thereof.

The proper amount of the hard water-softening agent added varies depending on the chelating ability thereof, the hardness of hard water and the amount of hard water, however, the amount used is generally from 0.01 to 5 wt %, preferably from 0.01 to 0.5 wt % based on the developer on use. If the amount added is less than this range, the intended object may not be satisfactorily attained, whereas if the amount added exceeds this range, there arise adverse effects on the image area, such as color stripping.

The printing original plate (i.e., the printing plate precursor) after the development is subjected to an after-treatment with washing water, a rinse containing a surface active agent and the like, or a desensitizing solution containing gum arabi or a starch derivative as described in JP-A-54-8002, JP-A-55-115045 and JP-A-59-58431. In the processing apparatus for use in the present invention, these processing operations may be performed by variously combining them.

The lithographic printing plate obtained through these processing operations is mounted on an offset printing press and used for printing a large number of sheets.

As the plate cleaner used for removing scumming on the plate at the printing, a conventionally well-known plate cleaner for PS plates may be used and examples thereof include CL-1, CL-2, CP, CN-4, CN, CG-1, PC-1, SR and IC [all produced by Fuji Photo Film Co., Ltd.].

With respect to the form in using the hydroxy ion obtained by passing a current between electrodes through the developer for the replenishment as an alkali component, any method such as (1) a method of introducing the developer underwent the current-carrying in the cathode chamber into the replenishing tank, (2) a method of replenishing the solution underwent the current-carrying in the cathode chamber to the developing tank and (3) a method of replenishing the solution underwent the current-carrying in the cathode chamber to the circulation route of the developing tank, may be used. Among these, the form of (3) is preferred.

<Development Processing Apparatus>

Apart from the portion relating to the electrolytic device, any development processing apparatus (sometimes called developing apparatus) used for general purpose on the market or publicly known may be used. Usually, a developing tank necessary for dissolving the imagewise alkali-soluble region of a material having a photosensitive resin composition in the developer is indispensable. In addition, the developing apparatus usually has a rinsing tank (washing tank) for use in the washing after the development, a desensitization processing tank and a drying part. Furthermore, an apparatus combined with the above-described after-treatment step may also be used.

The present invention is characterized in that hydroxy ion produced by the current-carrying is used as an alkali agent for the replenishment and detection means not relying on the pH is used for determining the degree of exhaustion of the developer. Therefore, the developing apparatus is also described mainly concerning these characteristic features.

FIG. 1 is a schematic view showing the structure of an electrolytic device for use in one embodiment of the present invention. In FIG. 1, the electrolytic device 1 is constituted by an electrolytic cell 2 and a pipeline 12 for transferring the cathode solution to the developing tank of a developing apparatus (not shown) and in this embodiment, further comprises a pipeline 13 for transferring the anode solution to the development stopping tank of a developing apparatus and a pipeline 10 for replenishing the electrolytic solution to the electrolytic device. The electrolytic cell 2 is divided into an anode chamber 3 and a cathode chamber 4 by the diaphragm 5. In respective electrolytic chambers, an anode 14 and a cathode 15 are provided. The flow of solution between the developing tank and the electrolytic chambers is shown by an arrow. To the anode 14 and the cathode 15, a dc current voltage is applied by voltage applying means 17 (a rectifier and an ac power source, or a battery, and control of applied voltage). The control part 16 controls the current-carrying.

To the solution preparing tank 6, fresh water 11 is piped through a changeover valve 8 and this pipeline is connected also to the electrolytic cell through a level sensor 7. The solution preparing tank is connected to the electrolytic chamber through a valve 9.

The diaphragm 5 may be sufficient if it has permeability to solutions to such an extent that the electroconductivity between the cathode chamber and the anode chamber is ensured, it can prevent the solutions in both tanks from excessively mixing, and it is free of attack by the developer or anode solution. Examples of the material which can be preferably used for the diaphragm include a neutral and porous membrane free of attack by the developer or anode solution (for example, biscuit porcelain plate), a polymer hydrophobic porous membrane [for example, commercially available Goatex Film (produced by Goatex)] and a polymer osmotic membrane [for example, commercially available MF (microfilter) film, UF (ultrafiltration) film, RO (reverse osmosis) film]. In addition, an ion exchange membrane may also be used and both an anion exchange membrane (for example, those under the product names Selemion AWV/AMR and Anion-Type Aciplex produced by Asahi Glass Company, Ltd.) and a cation exchange membrane (Nafion produced by Du Pont and Flemion and Cation-Type Aciplex produced by Asahi Glass Company, Ltd.) are suitable for the object of the present invention.

In particular, a divalent selective anion exchange membrane is preferred because of less mixing of the anode solution and the cathode solution and small increase of the electric resistance.

For the electrode, any material may be used as long as it is an electro-inactive material. Preferred examples of the anode material include lead dioxide, graphite, lead and platinum, such as commercially available carbon sheet (Kuresheet, produced by Kureha Chemical Industry Co., Ltd.). Examples of the cathode material which can be used include stainless steel (e.g., SUS303, SUS316), copper, silver, graphite, lead and platinum, such as commercially available SUS316 (NTK316, produced by Nippon Kinzoku Co., Ltd.). These electrode materials are available on the market.

With respect to the electrolytic solution for the cathode chamber, as already described above, the developer is suitably used and for the purpose of compensating the evaporated content during the term of continuing the development, the developer may be used after diluting it with water to some extent.

The action in this electrolytic device is described below. When a voltage is applied between the anode 14 and the cathode 15 to allow a current to pass, hydroxy ion and hydrogen ion are produced in the cathode chamber and the anode chamber to cause a change toward alkalinity and acidity, respectively. The cathode solution is fed to the developing tank as a replenisher through the pipeline 12, whereby the development activity in the developing tank is maintained and the development is stably performed. On the other hand, in one embodiment of the present invention, the acidic electrolytic solution in the anode chamber in the apparatus shown in FIG. 1 is transferred to the development stopping tank in the developing apparatus so as to neutralize the alkali adhering to the developed photosensitive resin composition and deprive the composition film of swelling, thereby increasing its physical strength. At the same time, water washing may also be performed. The anode chamber and the cathode chamber are partitioned by the diaphragm and prevented from directly mixing each other.

The solution preparing tank 6 substantially serves both as a solution preparing tank for preparing a fresh developer and as a reservoir tank for reserving the used developer for the reuse. More specifically, fresh water 11 is fed through a value 8 and a developing agent is charged thereinto to prepare a developer. Other than that, an overflow solution (not shown) returned from the developing tank may be reserved. In either case, the developer prepared or preserved in this tank is transferred to the cathode chamber through a value 10, where a current is passed to supply an alkali component (hydroxy ion) and thereby the developer is put into the state of replenisher. The replenisher is transferred to the developing tank though the liquid transferring pipeline 12, thereby performing the replenishment. By changing over the pipeline system using the changeover valve, the anode solution may be prepared in the solution preparing tank 6 and fed to the anode chamber. The liquid level in each of the anode chamber and the cathode chamber is maintained constant by using a level sensor 7 and changing over a valve to allow fresh water 11 or the solution in the solution preparing tank 6 to flow into the chamber. In a preferred embodiment of the developing method, the used developer is reserved in the solution preparing tank 6, activated into the composition of the replenisher in the electrolytic cell and then reused.

As the electrolytic solution for the anode chamber, the developer may be used it may be a solution prepared by dissolving only the inorganic salt component of the developer composition in water. A used developer may also be used and in this case, the pH is already lowered at the disposal as a development waste solution and therefore, the disposal advantageously costs low in proportion with the reduction of pH.

The current-carrying is suitably performed at a current density of from 0.1 to 10 A/dm$^2$, preferably from 0.1 to 5 A/dm$^2$, more preferably from 0.5 to 5 A/dm$^2$. The applied voltage is controlled so that the current density can fall in this range. However, the applied voltage varies depending on the shape of the apparatus, particularly, the distance between electrodes and the concentration of electrolyte in the developer, and it is usually from 1 to 100 V, preferably from 2 to 10 V.

The electrode area varies according to the substantial volume of the objective developing tank but an almost proper value can be obtained by a relative calculation while regarding the electrode area as 1 dm$^2$ when the volume of the developing tank is 1 liter. With such a relationship between the electrode area and the liquid amount in the developing tank, the current-carrying time is about 40 seconds per the amount necessary for developing 1 m$^2$ of a photosensitive resin composition The control of developer by passing a current (i.e., by carrying a current) is described below.

The detection means for reading the degree of exhaustion of the developer to practice the replenishment determines the exhaustion, as described above, using one of three means or a combination thereof, namely, the reading of the processed amount in the development, the integration of intervals where the developing apparatus is in the stand-by state and the dead state, and the reading of a physical property value of developer other than the pH, preferably one of the electroconductivity, the specific gravity and the opacity, more preferably the electroconductivity (i.e., electric conductivity).

In the case of detecting the degree of exhaustion of the developer using the processed amount in the development, a device for integrating the amount of photosensitive resin composition processed, which is measured by an infrared sensor or obtained by the contact measurement, is disposed in the development processing apparatus. The processed amount is obtained as an area from the time of the photosensitive resin composition being transported to the developing tank, and the width and transportation speed of the composition. The processed amounts obtained are integrated. The thus-obtained information on the processed amount in the development is sent to the control part 16 of the electrolytic device shown in FIG. 1. The above-described device for integrating the processed amounts is known and being used in practice.

In the case of detecting the degree of exhaustion of the developer using the integrated time of intervals where the development is not performed, compensation for the reduction in aging of the pH or amount of the alkali component in the development due to the carbon dioxide gas in air is actually done. In this compensation, the power source of the developing apparatus is turned on by a timer capable of recording the operating condition of the developing machine and respective intervals in the stand-by state and in the dead state of the developing machine are integrated and recorded. In the typical embodiment of the present invention, the operation for compensating the effect of the carbon dioxide gas is performed by applying a voltage to the electrolytic cell every each time when the integrated value of the stand-by intervals exceeds 4 hours, and thereby passing (i.e., carrying) an electrolytic current. If the development processing apparatus is in the dead state, the dead intervals are integrated and when the power source of the development processing apparatus is turned on next time, a current is passed for a time period in correspondence to the intervals integrated until that time.

In the case of performing the control by selecting the electroconductivity as the physical property value, an electroconductivity meter is disposed at an appropriate site in the circulating system of the developer, preferably in the developing tank or in the stirring and circulating part of the developing tank.

The thus-obtained information relating to the exhaustion of developer is sent to the control part 16 of FIG. 1 and thereby the duration of applying a voltage to electrodes is controlled.

In the case of controlling the current-carrying time by the amount of the photosensitive resin composition processed, the duration of applying a voltage is selected, as a standard, such that the quantity of current-carrying is 600 coulomb per 1 $m^2$ of the processed amount. Of course, the duration of applying a voltage varies depending on the thickness of the coated layer of photosensitive resin composition or the amount of components dissolved out (in turn, the exposure amount and the like) and must be controlled according to the actual working. In the case of controlling the current-carrying time by the integrated time of stand-by intervals and the dead intervals of the developing machine, the duration of applying a voltage is selected, as a standard, for the development processing apparatus on an average scale, such that the quantity of current-carrying is 600 coulomb when the integrated time of the stand-by intervals and the integrated time of the dead intervals each is 4 hours. However, the carbon dioxide gas concentration in an indoor environment varies depending on the seasonal change, the work concurrently proceeding or the ventilating condition, therefore, needless to say, the current-carrying time must be further controlled in practice.

In the case of controlling the current-carrying time by the electroconductivity of the developer on use, the electrolysis time is preferably controlled such that the change of electroconductivity falls within 5%, preferably 2%, more preferably 1% of the standard value. With the average composition of developer to which the present invention is applied, the electroconductivity is from 40,000 to 60,000 $\mu s/cm$. When the electroconductivity of the developer is 50,000 $\mu s/cm$, the change of 1% is 500 $\mu s/cm$ and this value is a value which can be read by an electroconductivity meter in good precision. Since the alkali metal ion increases or decreases along with the dissolution of the photosensitive resin composition, the electroconductivity of which change responds only to the change in the hydrogen ion concentration is advantageous as an index and this is more sensitive to the exhaustion of developer than the pH value which logarithmically responds.

To more specifically describe the operation of passing a current and the control of replenishment, an electroconductivity meter always monitors the electroconductivity of developer during the operation of the development processing apparatus and the information obtained is transmitted to the control unit FIG. 1. When the electroconductivity value is reduced to 1% of the standard value, namely, 500 $\mu s/cm$, the control unit in FIG. 1 applies a voltage between the electrodes 14 and 15 based on the information. When the current-carrying time reaches 20 seconds, the quantity of current-carrying becomes 300 coulomb. If the electroconductivity is recovered to the range within 1% of the standard value at this time, the application of voltage is terminated, but if not recovered to the range within 1%, the current is continuously passed until the next control cycle. By this control sequence, the current-carrying and the replenishment are controlled.

The above-described three methods for controlling the replenishment may be used either individually or in combination. In view of the stability in the development step, the combination use of those three methods for controlling the replenishment is most preferred. Next preferred is the control by the electroconductivity or the combination of the information on the processed amount in the development with the control based on the information on the integrated time of intervals in the operable state.

In the case of detecting the degree of exhaustion of the developer using the specific gravity or opacity, the initial physical property value (initial value) is taken as a basis and by reading the change from the initial value, the current-carrying time is controlled according to the value read, because those physical property values each varies along with the development.

During the passing of a current, hydroxy ion is generated in the cathode chamber and the developer is activated as described above. On the other hand, hydrogen ion is generated in the anode chamber and this hydrogen ion can also be used in the development processing. More specifically, when the anode solution containing hydrogen ion generated in the anode chamber side by the current-carrying is used to form a part or the whole of washing water (also serves as a stopping solution) in the water washing step subsequent to the development of a material having a photosensitive resin composition, the water washing can be effectively performed such that the non-dissolved area of the photosensitive resin composition is prevented from excessively swelling and also increased in the physical strength. At this time, the components dissolved out during the development may be insolubilized and precipitated in the washing water waste solution. In this case, as long as the precipitate is concerned, the components are separated from the waste solution and the waste solution can be easily treated. The apparatus in this system where hydrogen ion generated by the current-carrying is also used is described in more detail in the Examples.

In another method, the used developer may be used as the anode solution, so that the alkali component can be neutralized and the load on the treatment of waste solution can be reduced.

As another embodiment of the present invention, a function sharing system using two units of electrolytic cells may be used, where two units of electrolytic cells are provided, one unit is always current-carried at a current quantity capable of attaining current-carrying large enough to compensate the aging deterioration due to the absorption of carbon dioxide gas in air at the time when the development is not performed, and another unit is current-carried only when the development is performed, so as to compensate the exhaustion due to the development processing. By taking a system of sharing the response to the exhaustion in the development processing and the response to the aging exhaustion of developer, a development processing apparatus equipped with an electrolytic device suppressed in the electric capacity can be designed.

In this case, the electrolytic device for the compensation of the effect by the absorption of carbon dioxide gas is always current-carried irrespective of the development processing time or the dead time, therefore, the electrolytic device for the compensation of the exhaustion of developer occurring with the development processing does not of course compensate the exhaustion due to the absorption of carbon dioxide gas.

The electrolytic device for the compensation of the exhaustion of developer occurring with the development processing may employ, as means for detecting the exhaustion of developer, the processed amount in the development or a physical property value such as electroconductivity, specific gravity and opacity.

[Applicable Photosensitive Material]

The material having a photosensitive resin composition to which the present invention can be applied may be any of a photosensitive material for lithographic printing, a photosensitive material for printed wiring substrate and a photoresist for forming a high definition pattern of an integrated circuit or the like. Among these, a photosensitive material for lithographic printing is preferred, a PS plate is more preferred, and a positive photosensitive resin composition is still more preferred.

The positive photosensitive resin composition may be sufficient if it can vary in the solubility or swellability in the developer between before and after the exposure. The composition is also used as a PS plate in many cases. The photosensitive agent is preferably an o-quinonediazide compounds. For example, in the case of a positive photosensitive resin composition containing an alkali-soluble resin and an o-quinonediazide compound, the o-quinonediazide compound is preferably a compound having at least one o-quinonediazide group and capable of increasing in the solubility in an alkali aqueous solution by an active light.

As the compound having this type of quinonediazide group, compounds having various structures are known and described in detail, for example, in J. Kosar, *Light-Sensitive Systems*, pp. 336–352, John Wiley & Sons, Inc. (1965).

The positive photosensitive resin composition is suitably a sulfonic acid ester of a hydroxyl compound of various types with o-benzoquinonediazide or o-naphthoquinonediazide.

As the photosensitive resin composition which is a positive photosensitive resin composition but not o-quinonediazide, a chemical amplification-type photosensitive resin composition obtained by combining a water-insoluble and alkali-soluble compound in which the alkali soluble group is protected by an acid decomposition group, with a photoacid generating agent may be used. The photosensitive resin composition adopting the chemical amplification system is used as a lithographic printing material or a photoresist for the high definition microfabrication of an integrated circuit or the like. The development of this composition is attained using the alkali solubilization of the exposed area.

The photoacid generating agent for use in the chemical amplification system may be a known one. The photoacid generating agent may be appropriately selected from the compound group consisting of photoinitiators for photocationic polymerization, photoinitiators for photoradical polymerization, photodecolorizing agents for dyes, photodiscoloring agents, compounds capable of generating an acid by known light being used for microresist and the like, and mixtures thereof.

The water-insoluble and alkali-soluble compound used in combination with the photoacid generating agent in the chemical amplification-type photosensitive resin composition, in which the alkali soluble group is protected by an acid decomposition group, is a compound having a —C—O—C— or —C—O—Si— bond. Examples thereof include the following compounds:

(a) compound containing at least one o-carboxylic acid ester and/or a carboxylic acid amide acetal group and capable of having polymerizability, in which the carboxylic acid amide acetal group can be produced as a cross-linking element in the main chain or as a side substituent;

(b) oligomerizable or polymer compound containing a poly acetal and/or a ketal group;

(c) compound containing at least one enol ester or an N-acylaminocarbonate group;

(d) cyclic acetal or ketal of β-ketoester or β-ketoamide;

(e) compound containing a silyl ether group;

(f) compound containing a silyl enol ether group;

(g) monoacetal or monoketal of which aldehyde or ketone component has a solubility of from 0.1 to 100 g/λ in the developer;

(h) tertiary alcohol-based ether; and (i) carboxylic acid ester and carbonic acid ester of tertiary allyl-position or benzyl-position alcohol.

Examples of the water-insoluble and alkaline aqueous solution-soluble synthetic resin (hereinafter referred to as an "alkali-soluble resin") include phenol.formaldehyde resin, cresol.formaldehyde resin, phenol.cresol.formaldehyde copolycondensed resin, phenol-modified xylene resin, polyhydroxystyrene, polyhalogenated hydroxystyrene, copolymers of N-(4-hydroxyphenyl)methacrylamide and hydroquinone monomethacrylate copolymer, and additionally include sulfonylimide-based polymers described in JP-A-7-28244 and carboxyl group-containing polymers described in JP-A-7-36814. Furthermore, various alkali-soluble polymer compounds such as acrylic resin containing a phenolic hydroxyl group disclosed in JP-A-51-34711, acrylic resin having a sulfonamide group described in JP-A-2-866 and urethane-based resin may also be used. The alkali-soluble polymer compound preferably has a weight average molecular weight of from 500 to 20,000 and a number average molecular weight of from 200 to 60,000.

These alkali-soluble polymer compounds may be used individually or in combination of two or more thereof. The alkali-soluble polymer compound is added in an amount of 80 wt % or less based on the entire composition.

A material having a photopolymerizable photosensitive resin composition, which is one of the materials having a photosensitive resin composition for use in the present invention, is described below.

The main component of the photopolymerizable photosensitive resin composition for use in the present invention is a compound containing an addition-polymerizable ethylenical double bond, a photopolymerization initiator or the like. If desired, a compound such as thermal polymerization inhibitor is added thereto.

The compound containing an addition-polymerizable double bond may be freely selected from the compounds having at least one, preferably two or more, terminal ethylenically unsaturated bond. The compound has a chemical form of, for example, a monomer, a prepolymer (e.g., dimer, trimer, oligomer), a mixture thereof or a copolymer thereof.

Examples of the monomer and the copolymer thereof include esters of unsaturated carboxylic acid (e.g., acrylic acid, methacrylic acid, itaconic acid, crotonic acid, isocrotonic acid, maleic acid) with an aliphatic polyhydric alcohol compound, and amides of unsaturated carboxylic acid with an aliphatic polyhydric amine compound.

The photopolymerization initiator contained in the photopolymerizable photosensitive resin composition for use in the present invention may be appropriately selected from various photopolymerizable initiators known in the patents and publications (e.g., literature), and combination systems (photopolymerization initiating systems) using two or more photopolymerization initiators, according to the wavelength of the light source used.

For example, in the case of using light in the vicinity of 400 nm as the light source, benzyl, benzoin ether, Michler's ketone, anthraquinone, thioxanthone, acridine, phenazine and benzophenone are widely used.

The present invention can be applied not only to the above-described positive PS plate using a compound having quinonediazide or an alkali-soluble group protected by an acid decomposable group or negative PS plate using a photopolymerization system but also to lithographic printing plate materials described below and resists for forming a printed wiring or an integrated circuit:

(1) negative lithographic printing plate material using diazo resin;
(2) negative lithographic printing plate material using a photo-crosslinking resin;
(3) negative laser direct drawing lithographic printing material containing an alkali-soluble binder, an acid generating agent and an acid (heat) crosslinkable compound; and
(4) positive laser direct drawing lithographic printing material containing an alkali-soluble binder and a substance which is thermally decomposable and in the non-decomposed state, substantially reduces the solubility of the alkali-soluble binder.

The coated amount (solid content) of the image-forming layer obtained after the coating and drying varies depending on the use end, however, in the case of a general lithographic printing original plate, it is preferably from 0.5 to 5.0 g/m$^2$, more preferably from 0.5 to 1.5 g/m$^2$. The thickness of the layer is from 0.01 to 100 μm, preferably from 0.1 to 10 μm, more preferably from 0.3 to 1 μm.

[Support]

The photosensitive resin composition is coated on a support selected according to the use end. For the support, a dimensionally stable plate-like material is used. Examples of the support which can be used in the present invention include paper, paper laminated with plastic (e.g., polyethylene, polypropylene, polystyrene), a metal plate (e.g., aluminum, zinc, copper, nickel, stainless steel), plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal), and paper or plastic film laminated or deposited with a metal described above.

The substrate for use in the present invention has a thickness of approximately from 0.05 to 0.6 mm, preferably from 0.1 to 0.4 mm, more preferably from 0.15 to 0.3 mm.

In advance of surface-roughening the aluminum sheet, the aluminum sheet is, if desired, subjected to a degreasing treatment with, for example, a surface active agent, an organic solvent or an alkaline aqueous solution so as to remove the rolling oil on the surface.

[Plate-Making]

The thus-prepared lithographic printing plate is usually subjected to imagewise exposure and development.

<Imagewise Exposure>

Examples of the light source emitting an active (light) ray for use in the imagewise exposure include mercury lamp, metal halide lamp, xenon lamp, chemical lamp and carbon arc lamp. Examples of the radio active ray include electron beam, X ray, ion beam and far infrared ray. Also, g ray, i ray, Deep-UV light or high-density energy beam (laser beam) may be used. Examples of the laser beam include helium-.neon laser, argon laser, krypton laser, helium.cadmium laser and KrF eximer laser. In the case of a laser direct drawing printing plate, a light source having a light emission wavelength in the region of from near infrared to far infrared is preferred, and a solid laser and a semiconductor laser are more preferred.

The printing original plate comprising the materials described above is transported to the development part through the heating part of the processing apparatus, where the plate is dipped in a developer reserved, for example, in a developing tank and thereby developed.

The present invention also provides a method for developing a photosensitive lithographic printing plate precursor described in claim 10. That is, the photosensitive lithographic printing plate precursor used is a lithographic printing original plate having a photosensitive layer formed by coating an infrared laser use positive photosensitive composition containing at least (A) an alkali-soluble polymer compound, (B) a compound which compatibilizes with the alkali-soluble polymer compound to reduce the solubility of the polymer compound in an alkali aqueous solution and is diminished in the action of reducing the solubility on heating and (C) a compound which absorbs light and thereby generates heat, wherein the activity of the developer is maintained by passing a current between electrodes of current-carrying means appending to development means and having a cathode chamber, an anode chamber and electrodes, through the developer in the cathode chamber. In other words, the development processing method of the present invention is characterized in that the activity is imparted by electrolysis and the hydroxy ion generated by the current-carrying prevents the reduction in the activity of developer, so that the stable development quality can be maintained. The above-described photosensitive printing original plate has a property such that the developability deteriorates in aging. The degree of deterioration varies depending on the time period of storing the original plate (i.e., the printing plate precursor) used. However, when the development processing is performed using the above-described electrolytic activation system, the above-described defect does not come out into a serious problem. Furthermore, the fluctuation in the development conditions within a day or over days scarcely causes any effect, so that the developability can be stably maintained.

As in claim 11 of the present invention, the photosensitive lithographic printing original plate to which the development processing method of the present invention is applied is preferably a lithographic printing original plate having a photosensitive layer containing, in addition to the constituent components (A), (B) and (C) described above, (D) a cyclic acid anhydride represented by the following formula (I):

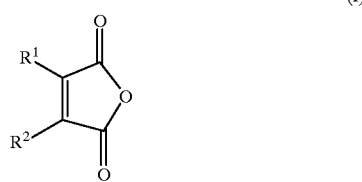

wherein $R^1$ and $R^2$ each independently represents hydrogen atom or an alkyl, alkenyl, alkoxy, cycloalkyl, aryl, carbonyl, carboxy or carboxylic acid ester group having from 1 to 12 carbon atoms, which may have a substituent, and $R^1$ and $R^2$ may be combined with each other to form a ring structure.

As described in claim 12, in the development processing method using the electrolytic activation of the present invention, when the photosensitive lithographic printing original plate is dipped in a developer and thereby developed, the activity of developer is maintained by controlling the quantity of current passed between electrodes through the developer according to the degree of exhaustion of the developer occurring with the development and thereby controlling the production of hydroxy ion supplied to the developer.

The means for detecting the exhaustion of developer occurring with the development is selected from the following three means:

(1) reading of the processed area of the photosensitive lithographic printing original plate, (2) integration of intervals where the development of the photosensitive lithographic printing original plate is not performed in the development processing apparatus, and (3) measurement of the electric conductivity (hereinafter simply referred to as electroconductivity), specific gravity or opacity of the developer stored in the development processing apparatus, and a combination use of two or more thereof is more effective.

When the electrolytic activation system is adopted, the hydroxy ion is generated in the cathode chamber and this is used for maintaining the activity of developer. At this time, hydrogen ion is also generated in the anode chamber and as described in claim 14, this hydrogen ion is introduced into a processing bath of the washing or stopping step subsequent to the development step, and reduces the pH, so that the water washing or stopping can be accelerated and also the load on the treatment of development waste solution discharged can be reduced.

The developing apparatus of claim 15 is a developing apparatus for use in the development processing of photosensitive lithographic printing original plates, comprising development means for sequentially processing photosensitive lithographic printing original plates with a developer, detection means for detecting the exhaustion of developer occurring with the development or with the aging of developer, current-carrying means for passing a current between electrodes through the developer to generate hydroxy ion, and circulation means (i.e., liquid transfer means) for connecting the development means and the current-carrying means.

The current-carrying means is an electrolytic device comprising a cathode chamber, an anode chamber, a porous membrane or a liquid junction for enabling current-carrying between the cathode chamber and the anode chamber, and electrodes provided in respective chambers, where hydroxy ion and hydrogen ion are generated in the cathode chamber and the anode chamber, respectively, by the electrolysis of water.

The developing apparatus described in claim 16 is an apparatus for use in the embodiment of using the hydrogen ion generated in the anode chamber in the washing or stopping step, where in addition to the above-described means, washing or shopping means and liquid transfer means for connecting the current-carrying means and the anode chamber are provided.

In the plate-making process of the present invention, the image formation mechanism is considered to proceed as follows: (A) an alkali-soluble polymer compound (hereinafter sometimes called "Component (A)") is combined with (B) a compound which has a group capable of interacting with the alkali-soluble polymer compound within the molecule and compatibilizes with the polymer compound to reduce the solubility of the polymer compound in an alkali aqueous solution and also which is diminished in the action of reducing the solubility by the heating (hereinafter sometimes called "Component (B)") and (C) a compound which absorbs light and thereby generates heat, so that Component (B) can uniformly compatibilizes with Component (A) at the film formation to reduce the solubility of Component (A) in an alkali aqueous solution. When the photosensitive layer is subjected to exposure under the irradiation of an infrared laser, (C) the compound which absorbs light and generates heat in the exposed area generates heat and due to the heat, Component (A) and Component (B) are separated and thereby the dissolution preventing ability owing to the interaction therebetween is diminished. As a result, the exposed area is removed by the alkali development processing solution in the development step. Accordingly, this photosensitive original plate has a property such that Component (B) changes in aging of the original plate to cause a change in the pH of the photosensitive composition of the original plate and since the photosensitization process is a thermal reaction, the discriminating property is inferior to that of the conventional light-mode photosensitive original plate and even a slight change in the activity of the developer gives a large effect. In the electrolytic activation-type developing method of the present invention, the supply of hydroxy ion generated on electrolysis seems to prevent occurring of this change.

The electrolytic activation-type developing method is known in the field of development of silver halide light-sensitive materials, however, there is no effect on the developer for printing original plates such as PS plate, having an extremely high pH and poor buffering property, therefore, this method has been not put into practical use.

When the above-described heat-mode original plate is stored for a long period of time, the developability at the exposed area of the photosensitive layer is gradually deteriorated. However, it is considered that when (D) a cyclic acid anhydride represented by formula (I) is added, the structure has a bond conjugating with the carbonyl group of a carboxylic acid anhydride, therefore, the carbonyl group is increased in the stability, decreased in the decomposition rate during the storage aging and decomposed at a proper rate to gradually generate an acid, so that the developability of a constant level can be always maintained in the photosensitive layer and the solubility in an alkali development processing solution can be maintained for a long period of time. Accordingly, by applying the developing method of the present invention to the development of a printing original plate containing Component (D), the development quality can be more stabilized.

The photosensitive lithographic printing original plate, the exposing and developing method for recording an image, the development processing apparatus, and the plate-making method for use in the present invention are described in sequence below.

[Lithographic Printing Original Plate]

The photosensitive lithographic printing original plate for use in the present invention is described below. This printing original plate comprises a support having thereon a photosensitive layer formed by coating an infrared laser use positive photosensitive composition (hereinafter sometimes simply referred to as a "photosensitive composition") and if desired, further comprises other layers.

(Photosensitive Layer)

The infrared laser use positive photosensitive composition contained in the photosensitive layer comprises (A) an alkali-soluble polymer compound, (B) a compound which compatibilizes with the alkali-soluble polymer compound to reduce the solubility of said polymer compound in an alkali aqueous solution and is diminished in the action of reducing said solubility on heating, (C) a compound which absorbs light and thereby generates heat and (D) a cyclic acid anhydride represented by formula (I) and further contains, if desired, other components.

Each component of the photosensitive composition for use in the lithographic printing original plate of the present invention is described below.

(A) Alkali-Soluble Polymer Compound

The alkali-soluble polymer compound for use in the present invention is not particularly limited as long as it is conventionally known, however, the compound is preferably a polymer compound having any one functional group of (A-1) a phenolic hydroxyl group, (A-2) a sulfonamide group and (A-3) an active imide group within the molecule.

Examples thereof include the following compounds, however, the present invention is by no means limited thereto.

Examples of the polymer compound having (A-1) a phenolic hydroxyl group include novolak resins such as phenol formaldehyde resin, m-cresol formaldehyde resin, p-cresol formaldehyde resin, m-/p-cresol mixture formaldehyde resin, phenol/cresol (any of m-cresol, p-cresol and a mixture of m-cresol and p-cresol) and mixed formaldehyde resin, and pyrogallol acetone resin.

Other than these, polymer compounds having a phenolic hydroxyl group on the side chain are preferably used as the polymer compound having a phenolic hydroxyl group. Examples of the polymer compound having a phenolic hydroxyl group on the side chain include polymer compounds obtained by homopolymerizing a polymerizable monomer comprising a low molecular compound having one or more unsaturated bond polymerizable with a phenolic hydroxyl group, or copolymerizing this monomer with another polymerizable monomer.

Examples of the polymerizable monomer having a phenolic hydroxyl group include acrylamide, methacrylamide, acrylic acid ester, methacrylic acid ester and hydroxystyrene each having a phenolic hydroxy group.

Specific examples of the polymerizable monomer, which can be suitably used, include N-(2-hydroxyphenyl)acrylamide, N-(3-hydroxyphenyl)acrylamide, N-(4-hydroxyphenyl)acrylamide, N-(2-hydroxyphenyl)methacrylamide, N- (3-hydroxy-phenyl)methacrylamide, N-(4-hydroxyphenyl)methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl)ethyl acrylate, 2-(3-hydroxyphenyl) ethyl acrylate, 2-(4-hydroxyphenyl)ethyl acrylate, 2-(2-hydroxyphenyl)ethyl methacrylate, 2-(3-hydroxyphenyl) ethyl methacrylate and 2-(4-hydroxyphenyl)ethyl methacrylate.

These resins having a phenolic hydroxy group may be used in combination of two or more thereof.

Examples of the alkali-soluble polymer compound having (A-2) a sulfonamide group include polymer compounds obtained by homopolymerizing a polymerizable monomer having a sulfonamide group or copolymerizing this monomer with another polymerizable monomer.

Examples of the polymerizable monomer having a sulfonamide group include polymerizable monomers comprising a low molecular compound having at least one sulfonamide group —NH—SO$_2$— bonded to at least one hydrogen atom on the nitrogen atom and at least one polymerizable unsaturated bond within one molecule. Among these, low molecular compounds having an acryloyl group, an allyl group or a vinyloxy group, and a substituted or monosubstituted aminosulfonyl group or a substituted sulfonylimino group are preferred.

Examples of this compound include the compounds represented by the following formulae (II) to (VI):

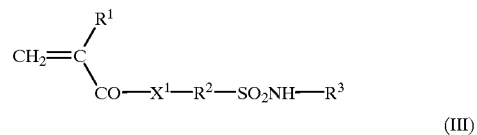

(II)

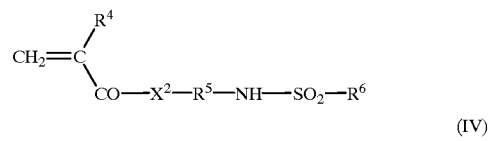

(III)

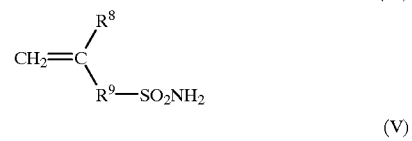

(IV)

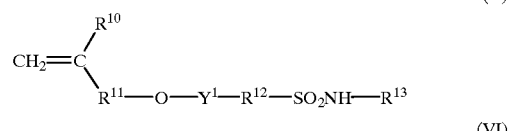

(V)

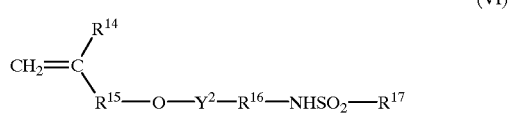

(VI)

wherein $X^1$ and $X^2$ each represents —O— or —NR$^7$—, $R^1$ and $R^4$ each represents hydrogen atom or —CH$_3$, $R^2$, $R^5$, $R^9$, $R^{12}$ and $R^{16}$ each represents an alkylene, cycloalkylene, arylene or aralkylene group having from 1 to 12 carbon atoms which may have a substituent, $R^3$, $R^7$ and $R^{13}$ each represents hydrogen atom or an alkyl, cycloalkyl, aryl or aralkyl group having from 1 to 12 carbon atoms which may have a substituent, $R^6$ and $R^{17}$ each represents an alkyl, cycloalkyl, aryl or aralkyl group having from 1 to 12 carbon atoms which may have a substituent, $R^8$, $R^{10}$ and $R^{14}$ each represents hydrogen atom or —$CH_3$, $R^{11}$ and $R^{15}$ each represents a single bond or an alkylene, cycloalkylene, arylene or aralkylene group having from 1 to 12 carbon atoms which may have a substituent, and $Y^1$ and $y^2$ each represents a single bond or —CO—.

Specific examples of the compound, which can be suitably used, include m-aminosulfonylphenyl methacrylate, N-(p-aminosulfonylphenyl)methacrylamide and N-(p-aminosulfonylphenyl)acrylamide.

The alkali-soluble polymer compound having (A-3) an active imide group preferably has an active imide group represented by the formula shown below within the molecule and examples of this polymer compound include polymer compounds obtained by homopolymerizing a polymerizable monomer comprising a low molecular compound having at least one active imide group represented by the formula shown below and at least one polymerizable unsaturated bond within one molecule, or copolymerizing this monomer with another polymerizable monomer.

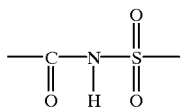

Specific examples of this compound, which can be suitably used, include N-(p-toluenesulfonyl)methacrylamide and N-(p-toluenesulfonyl)acrylamide.

As the alkali-soluble polymer compound for use in the present invention, a polymer compound obtained by polymerizing two or more of a polymerizable monomer having a phenolic hydroxyl group, a polymerizable monomer having a sulfonamide group and a polymerizable monomer having an active imide group, which are described above, or a polymer compound obtained by copolymerizing two or more of these polymerizable monomers with another polymerizable monomer is preferably used.

In the case of copolymerizing a polymerizable monomer having a phenolic hydroxyl group with a polymerizable monomer having a sulfonamide group and/or a polymerizable monomer having an active imide group, the weight ratio of these components blended is preferably from 50:50 to 5:95, more preferably from 40:60 to 10:90.

In the present invention, in the case where the alkali-soluble polymer compound is a copolymer of the above-described polymerizable monomer having a phenolic hydroxyl group, polymerizable monomer having a sulfonamide group or polymerizable monomer having an active imide group with another polymerizable monomer, the monomer capable of imparting alkali solubility is preferably contained in an amount of 10 mol % or more, more preferably 20 mol % or more. If the amount of the component copolymerized is less than 10 mol %, the alkali solubility is liable to be insufficient and the effect of improving the development latitude may not be sufficiently achieved.

Examples of the monomer component copolymerized with the above-described polymerizable monomer having a phenolic hydroxyl group, polymerizable monomer having a sulfonamide group or polymerizable monomer having an active imide group include the following monomers (1) to (12), however, the present invention is by no means limited thereto:

(1) acrylic acid esters and methacrylic acid esters having an aliphatic hydroxy group, such as 2-hydroxyethyl acrylate and 2-hydroxyethyl methacrylate;

(2) alkyl acrylates such as methyl acrylate, ethyl acrylate, propyl acrylate, butyl acrylate, glycidyl acrylate and N-dimethylaminoethyl acrylate;

(3) alkyl methacrylates such as methyl methacrylate, ethyl methacrylate, propyl methacrylate, butyl methacrylate, benzyl methacrylate, glycidyl methacrylate and N-dimethylaminoethyl methacrylate;

(4) acrylamides and methacrylamides such as acrylamide, methacrylamide, N-methylolacrylamide, N-ethylacrylamide, N-hydroxyethylacrylamide, N-phenylacrylamide and N-ethyl-N-phenylacrylamide;

(5) vinyl ethers such as ethyl vinyl ether, 2-chloroethyl vinyl ether, hydroxyethyl vinyl ether and phenyl vinyl ether;

(6) vinyl esters such as vinyl acetate, vinyl chloroacetate, vinyl butyrate and vinyl benzoate;

(7) styrenes such as styrene, α-methylstyrene, methylstyrene and chloromethylstyrene;

(8) vinyl ketones such as methyl vinyl ketone, ethyl vinyl ketone, propyl vinyl ketone and phenyl vinyl ketone;

(9) olefins such as ethylene, propylene, isobutylene, butadiene and isopropylene;

(10) N-vinylpyrrolidone, N-vinylcarbazole, 4-vinylpyridine, acrylonitrile and methacrylonitrile,

(11) unsaturated imides such as maleimide, N-acryloylacrylamide, N-acetylmethacrylamide, N-propionylmethacrylamide and N-(p-chlorobenzoyl)methacrylamide; and

(12) unsaturated carboxylic acids such as acrylic acid, methacrylic acid, maleic acid anhydride and itaconic acid.

In the present invention, when the alkali-soluble polymer compound is a homopolymer or a copolymer of a polymerizable monomer having a phenolic hydroxyl group, a polymerizable monomer having a sulfonamide group or a polymerizable monomer having an active imide group, a polymer compound having a weight average molecular weight of 2,000 or more and a number average molecular weight of 500 or more is preferred, and a polymer compound having a weight average molecular weight of from 5,000 to 300,000, a number average molecular weight of from 800 to 250,000 and a dispersion degree (weight average molecular weight/number average molecular weight) of from 1.1 to 10 is more preferred.

In the present invention, when the alkali-soluble polymer compound is a resin such as phenol formaldehyde resin or cresol aldehyde resin, those having a weight average molecular weight of from 500 to 20,000 and a number average molecular weight of from 200 to 10,000 are preferred.

These alkali-soluble polymer compounds may be used either individually or in combination of two or more thereof. The alkali-soluble polymer compound is used in an amount of from 30 to 99 wt %, preferably from 40 to 95 wt %, more preferably from 50 to 90 wt %, based on all solid contents of the photosensitive composition. If the amount of the alkali-soluble polymer compound added is less than 30 wt %, the photosensitive layer is deteriorated in the durability, whereas if it exceeds 99 wt %, disadvantageous effects may result in both the sensitivity and the durability.

(B) Compound which Compatibilizes with Alkali-Soluble Polymer Compound to Reduce Solubility of Polymer Compound in Alkali Aqueous Solution and is Diminished in Action of Reducing Solubility on Heating Component (B) indicates a compound having good compatibility with (A) an alkali-soluble polymer compound to form a uniform coating solution owing to the action of the hydrogen-bonding functional group present in the molecule and at the same time having a function of inhibiting the alkali solubility of Component (A) by the interaction with Compound (A). This compound loses the action of reducing the solubility on heating and in the case where Component (B) itself is decomposed on heating, if a sufficiently large energy is not imparted due to the conditions such as laser output and irradiation time, the reduction brought out by the action of inhibiting the solubility is insufficient and the sensitivity may decrease, therefore, the thermal decomposition temperature of Component (B) is preferably 150° C. or more.

Suitable examples of Component (B) for use in the present invention include compounds capable of interacting with Component (A), such as sulfone compound, ammonium salt, phosphonium salt and amide compound.

Component (B) must be appropriately selected by taking account of the interaction with Component (A) and to speak specifically, for example, when a novolak resin is solely used as Component (A), Cyanine Dye A and the like described later are suitably used.

The blended ratio of Component (A) to Component (B) is usually preferably from 99/1 to 75/25. If Component (B) is less than 99/1, the interaction with Component (A) insufficiently proceeds, then the alkali solubility cannot be inhibited and the image formation may not be successfully performed, whereas if Component (B) exceeds 75/25, the interaction excessively proceeds to extremely decrease the sensitivity. Thus, the blended ratio outside the above-described range is not preferred.

(C) Compound which Absorbs Light and Generates Heat

In the present invention, the compound which absorbs light and generates heat means a compound having light absorption in the infrared region at 700 nm or more, preferably from 750 to 1,200 nm, and exhibiting a light/heat converting function with light having a wavelength in this range. To speak specifically, various pigments and dyes which absorb light in this wavelength region to generate heat may be used.

Examples of the pigment which can be used include commercially available pigments and pigments described in *Color Index (C.I.) Binran (C.I. Handbook)*, *Saishin Ganryo Binran (Handbook of Latest Pigments)*, compiled by Nippon Ganryo Gijutsu Kyokai (1977), *Saishin Ganryo Oyo Gijutsu (Up-To-Date Pigment Application Technology)*, CMC (1986), and *Insatsu Ink Gijutsu (Printing Ink Technology)*, CMC (1984).

The kind of pigment includes black pigment, yellow pigment, orange pigment, brown pigment, red pigment, ultraviolet pigment, blue pigment, green pigment, fluorescent pigment, metal powder pigment and polymer bond pigment. Specific examples of the pigment which can be used include insoluble azo pigments, azo lake pigments, condensed azo pigments, chelate azo pigments, phthalocyanine-based pigments, anthraquinone-based pigments, perylene- and perynone-based pigments, thioindigo-based pigments, quinacridone-based pigments, dioxazine-based pigments, isoindolinone-based pigments, quinophthalone-based pigments, dyed lake pigments, azine pigments, nitroso pigments, nitro pigments, natural pigments, fluorescent pigments, inorganic pigments and carbon black.

These pigments may not be surface treated or may be surface treated before use. For the surface treatment, a method of coating resin or wax on the surface, a method of attaching a surface active agent and a method of bonding a reactive substance (for example, silane coupling agent, an epoxy compound and polyisocyanate) to the pigment surface may be used. These surface treatment methods are described in *Kinzoku Sekken no Seishitsu to Oyo (Properties and Application of Metal Soap)*, Saiwai Shobo, *Insatsu Ink Gijutsu (Printing Ink Technology)*, CMC (1984), and *Saishin Ganryo Oyo Gijutsu (Up-To-Date Pigment Application Technology)*, CMC (1986).

The pigment preferably has a particle size of from 0.01 to 10 $\mu$m, more preferably from 0.05 to 1 $\mu$m, still more preferably from 0.1 to 1 $\mu$m. If the particle size of pigment is less than 0.01 $\mu$m, the dispersion is not stable in view of the stability in the coating solution for the photosensitive layer, whereas if it exceeds 10 $\mu$m, the photosensitive layer disadvantageously cannot be homogeneous.

For dispersing the pigment, a known dispersion technique for use in the production of ink or toner may be used. Examples of the disperser include ultrasonic disperser, sand mill, attritor, pearl mill, super-mill, ball mill, impeller, disperser, KD mill, colloid mill, dynatron, three roll mill and pressure kneader. These are described in detail in *Saishin Ganryo Oyo Gilutsu (Up-To-Date Pigment Application Technology)*, CMC (1986).

As the dye, commercially available dyes and known dyes described in publications (for example, *Senryo Binran (Handbook of Dyes)*, compiled by Yuki Gosei Kagaku Kyokai (1970)) may be used. Specific examples thereof include dyes such as azo dye, metal complex salt azo dye, pyrazolone azo dye, anthraquinone dye, phthalocyanine dye, carbonium dye, quinoneimine dye, methine dye and cyanine dye.

Among these pigments and dyes, those which absorb infrared light or near infrared light are preferred in the present invention because they are suitable for the use with a laser emitting infrared or near infrared light.

As the pigment which absorbs infrared or near infrared light, carbon black is suitably used. Examples of the dye which absorbs infrared or near infrared light include cyanine dyes described in JP-A-59-202829 and JP-A-60-78787, methine dyes described in JP-A-58-194595, naphthoquinone dyes described in JP-A-59-48187, JP-A-59-73996 and JP-A-60-52940, squarylium dyes described in JP-A-58-112792, cyanine dyes described in British Patent 434,875, and dihydro-pyrimidinesquarylium dyes described in U.S. Pat. No. 5,380,635.

As the above-described dye, the near infrared absorbing sensitizers described in U.S. Pat. No. 5,156,938 are suitably used. In particular, substituted arylbenzo(thio)pyrylium salts described in U.S. Pat. No. 3,881,924, trimethinethiapyrylium salts described in JP-A-57-142645 (corresponding to U.S. Pat. No. 4,327,169), pyrylium-based compounds described in JP-A-58-220143, JP-A-59-146063 and JP-A-59-146061, cyanine dyes described in JP-A-59-216146, pentamethinethiapyrylium salts described in U.S. Pat. No. 4,283,475, pyrylium compounds described in JP-B-5-13514 and JP-B-5-19702, Epolight III-178, Epolight III-130, Epolight III-125 and Epolight IV-62A are preferably used.

Other preferred examples of the above-described dye include the near infrared absorbing dyes represented by formulae (I) and (II) of U.S. Pat. No. 4,756,993.

The dye or pigment may be added to the photosensitive composition in an amount of from 0.01 to 50 wt %, preferably from 0.1 to 10 wt %, in the case of a dye, more preferably from 0.5 to 10 wt % and in the case of a pigment, more preferably from 3.1 to 10 wt %, based on all solids content of the photosensitive layer. If the amount of pigment or dye added is less than 0.01 wt %, the sensitivity decreases, whereas if it exceeds 50 wt %, the homogeneity of the photosensitive layer is lost and the durability of the photosensitive layer deteriorates.

The dye or pigment may be added to the same layer as the layer to which other components are added or may be added to a layer provided separately. In the case of adding to a separate layer, it is preferred to add to a layer adjacent to the layer containing a substance which is thermally decomposable and in the non-decomposed state, substantially reduces the solubility of the alkali-soluble polymer compound for use in the present invention. The dye or pigment and the alkali-soluble polymer compound are preferably added to the same layer but may be added to separate layers.

Component (B+C)

In the present invention, one compound having the properties of both of (B) the compound which compatibilizes with said alkali-soluble polymer compound to reduce the solubility of said polymer compound in an alkali aqueous solution and is diminished in the action of reducing said solubility on heating and (C) the compound which absorbs light and thereby generates heat (hereinafter, the compound is referred to as "Component (B+C)") may be used in place of Components (B) and (C). Examples of the compound include those represented by the following formula (VII):

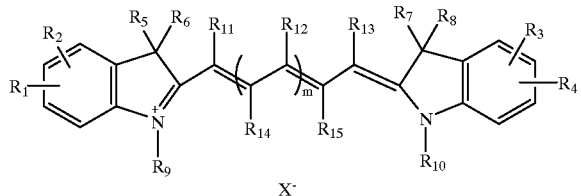

(VII)

In formula (VII), $R_1$ to $R_4$ each independently represents hydrogen atom or an alkyl, alkenyl, alkoxy, cycloalkyl or aryl group having from 1 to 12 carbon atoms which may have a substituent, and $R_1$ and $R_2$ or $R_3$ and $R_4$ may be combined to form a ring structure. $R_1$ to $R_4$ each specifically represents hydrogen atom, a methyl group, an ethyl group, a phenyl group, a dodecyl group, a naphthyl group, a vinyl group, an aryl group and a cyclohexyl group. In the case where these groups each has a substituent, examples of the substituent include a halogen atom, a carbonyl group, a nitro group, a nitrile group, a sulfonyl group, a carboxyl group, a carboxylic acid ester and a sulfonic acid ester.

$R_5$ to $R_{10}$ each independently represents an alkyl group having from 1 to 12 carbon atoms which may have a substituent. $R_5$ to $R_{10}$ each specifically represents a methyl group, an ethyl group, a phenyl group, a dodecyl group, a naphthyl group, a vinyl group, an allyl group or a cyclohexyl group. In the case where these groups each has a substituent, examples of the substituent include a halogen atom, a carbonyl group, a nitro group, a nitrile group, a sulfonyl group, a carboxyl group, a carboxylic acid ester and a sulfonic acid ester.

$R_{11}$ to $R_{13}$ each independently represents hydrogen atom, a halogen atom or an alkyl group having from 1 to 8 carbon atoms which may have a substituent $R_{12}$ may be combined with $R_{11}$ or $R_{13}$ to form a ring structure. In the case of m>2, a plurality of substituents $R_{12}$ may be combined with each other to form a ring structure. $R_{11}$ to $R_{13}$ each specifically represents chlorine atom, a cyclohexyl group or a cyclopentyl or cyclohexyl ring resulting from the combining of substituents $R_{12}$. In the case where these groups each has a substituent, examples of the substituent include a halogen atom, a carbonyl group, a nitro group, a nitrile group, a sulfonyl group, a carboxyl group, a carboxylic acid ester and a sulfonic acid ester. m represents an integer of from 1 to 8, preferably from 1 to 3.

$R_{14}$ and $R_{15}$ each independently represents hydrogen atom, a halogen atom or an alkyl group having from 1 to 8 carbon atoms which may have a substituent. $R_{14}$ and $R_{15}$ may be combined to form a ring structure. In the case of m>2, a plurality of substituents $R_{14}$ may be combined with each other to form a ring structure. $R_{14}$ and $R_{15}$ each specifically represents chlorine atom, a cyclohexyl group or a cyclopentyl or cyclohexyl ring resulting from the combining of substituents $R_{14}$. In the case where these groups each has a substituent, examples of the substituent include a halogen atom, a carbonyl group, a nitro group, a nitrile group, a sulfonyl group, a carboxyl group, a carboxylic acid ester and a sulfonic acid ester. m represents an integer of from 1 to 8, preferably from 1 to 3.

In formula (VII), $X^-$ represents an anion. Specific examples of the anion include perchloric acid, tetrafluoroboric acid, hexafluorophosphoric acid, triisopropylnaphthalenesulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoyl-benzenesulfonic acid and p-toluenesulfonic acid. Among these, hexafluorophosphoric acid, triisopropylnaphthalenesulfonic acid and alkyl aromatic sulfonic acid such as 2,5-dimethylbenzenesulfonic acid are preferred.

The compound represented by formula (VII) is a compound commonly called a cyanine dye. Specific examples of the compound, which can be suitably used, include the following compounds, however, the present invention is by no means limited to these specific examples.

Cyanine Dye A

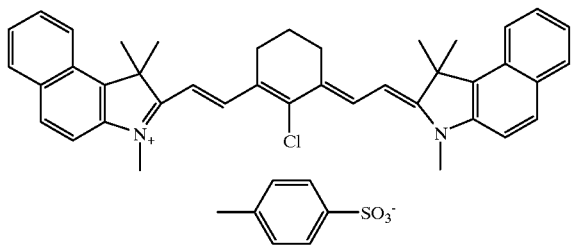

Cyanine Dye B

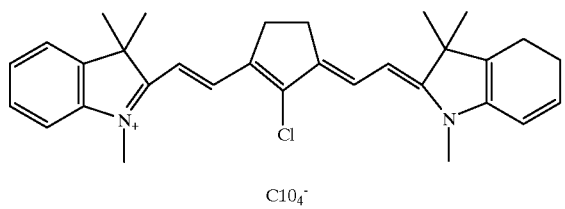

C10₄⁻

Cyanine Dye C

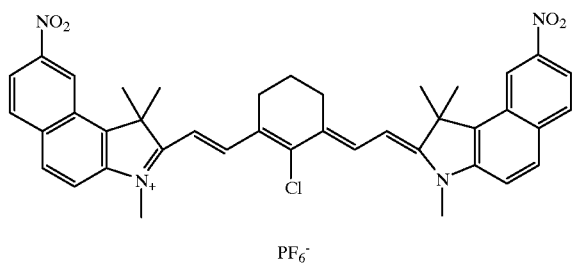

PF₆⁻

Cyanine Dye D

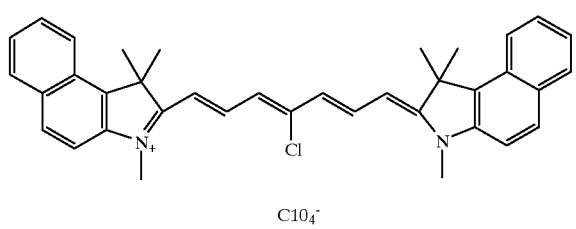

C10₄⁻

Cyanine Dye E

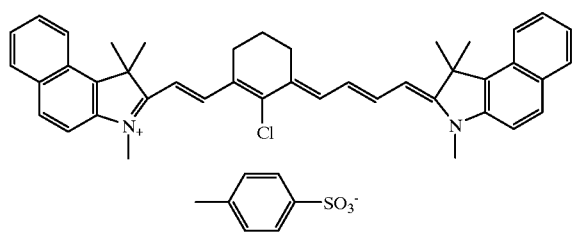

Component (B+C) can be suitably used in the present invention because it has a property of absorbing light and generating heat, has an absorption in the infrared region of from 700 to 1,200 nm, exhibits good compatibility with the alkali-soluble polymer compound, is a basic dye, contains a group capable of interacting with the alkali-soluble polymer compound, such as ammonium group or iminium group, within the molecule (namely, having the property of Component (B)), and by virtue of this group, can interact with the polymer compound and thereby control the alkali solubility of the polymer compound.

In the present invention, when Component (B+C) compound having the properties of both Component (B) and Component (C), such as a cyanine dye, is used in place of Components (B) and (C), the amount of the compound added is preferably in view of the sensitivity from 99/1 to 70/30, more preferably from 99/1 to 75/25, to Component (A).

(D) Cyclic Acid Anhydride

In the photosensitive lithographic printing original plate of the present invention, a cyclic acid anhydride is preferably used as an additional component. The cyclic acid anhydride is preferably a compound represented by formula (I) shown below, in which a bond conjugating with the carbonyl group of a carboxylic acid anhydride is present in the structure, therefore, the stability of the carbonyl group increases and the decomposition rate is controlled, as a result, decomposition proceeds at a proper rate during the storage aging to gradually generate an acid, so that the deterioration in the developability during the storage aging can be prevented. Accordingly, in maintaining the developer used in the developing method of the present invention for a long period of time, the object of the present invention can be more effectively attained.

(I)

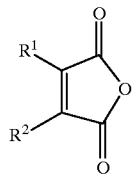

wherein $R^1$ and $R^2$ each independently represents hydrogen atom or an alkyl, alkenyl, alkoxy, cycloalkyl, aryl, carbonyl, carboxy or carboxylic acid ester group having from 1 to 12 carbon atoms, which may have a substituent, and $R^1$ and $R^2$ may be combined with each other to form a ring structure.

$R^1$ and $R^2$ each is preferably hydrogen atom or an unsubstituted alkyl, aryl, alkenyl or cycloalkyl group having from 1 to 12 carbon atoms. Specific examples thereof include hydrogen atom, a methyl group, an ethyl group, a phenyl group, a dodecyl group, a naphthyl group, a vinyl group, an aryl group and a cyclohexyl group.

In the case where $R^1$ and $R^2$ are combined with each other to form a ring structure, examples of the group formed include a phenylene group, a naphthylene group, a cyclohexene group and a cyclopentene group.

In the case where the group represented by $R^1$ or $R^2$ has a substituent, examples of the substituent include a halogen atom, a hydroxy group, a carbonyl group, a sulfonic acid ester, a nitro group and a nitrile group.

Among the acid anhydrides, compounds having a structure represented by the following formula (I-2) are preferred.

(I-2)

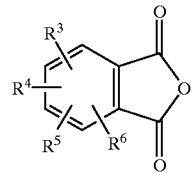

wherein $R^3$, $R^4$, $R^5$ and $R^6$ each independently represents hydrogen atom, a hydroxy group, a halogen atom such as chlorine, a nitro group, a nitrile group or an alkyl, alkenyl, alkoxy, cycloalkyl, aryl, carbonyl, carboxy or carboxylic acid ester group having from 1 to 12 carbon atoms which may have a substituent.

$R^3$, $R^4$, $R^5$ and $R^6$ each is preferably hydrogen atom, a halogen atom, an unsubstituted alkyl or alkenyl group having from 1 to 12 carbon atoms or an aryl group having from 6 to 12 carbon atoms. Specific examples thereof include a methyl group, a vinyl group, a phenyl group and an allyl group.

In the case where the group represented by $R^3$, $R^4$, $R^5$ or $R^6$ has a substituent, examples of the substituent include a halogen atom, a hydroxy group, a carbonyl group, a sulfonic acid ester, a nitro group, a nitrile group and a carboxy group.

Specific examples of the cyclic acid anhydride, which can be suitably used in the present invention, include phthalic acid anhydride, 3,4,5,6-tetrahydrophthalic acid anhydride, tetrachlorophthalic anhydride, 3-hydroxyphthalic acid anhydride, 3-phenylphthalic acid anhydride, trimellitic acid anhydride, pyromellitic acid anhydride, maleic acid anhydride, phenylmaleic acid anhydride, dimethylmaleic acid anhydride, dichloromaleic acid anhydride and chloromaleic acid anhydride.

The ratio of the cyclic acid anhydride occupying in the photosensitive composition solid contents is preferably from 0.5 to 20 wt %, more preferably from 1 to 15 wt %, still more preferably from 1 to 10 wt %. If the content is less than 0.5 wt %, the effect of maintaining the developability is insufficient, whereas if it exceeds 20 wt %, an image is not formed. Thus, the content out of the above-described range is not preferred.

Other Components

The photosensitive composition of the lithographic printing original plate of the present invention may contain, if desired, various additives.

For example, a substance which is thermally decomposable and in the non-decomposed state, substantially decreases the solubility of the alkali-soluble polymer compound, such as onium salt, o-quinonediazide compound, aromatic sulfone compound or aromatic sulfonic acid ester compound, is preferably used in combination from the standpoint of increasing the effect of inhibiting the dissolution of an image area in the developer.

Examples of the onium salt include diazonium salts, ammonium salts, phosphonium salts, iodonium salts, sulfonium salts, selenonium salts and arsonium salts.

For the onium salt used in the present invention, known compounds over a wide range can be used. Although other known compounds may also be used for the printing original plate of the present invention, representative examples of respective known compound groups include diazonium salts described in S. I. Schlesinger, *Photogr. Sci. Eng.*, 18, 387 (1974), and T. S. Bal et al., *Polymer*, 21, 423 (1980), ammonium salts described in JP-A-3-140140, phosphonium salts described in D. C. Necker et al., *Macromolecules*, 17, 2468 (1984), and U.S. Pat. No. 4,069,055, iodonium salts described in J. V. Crivello et al., *Macromolecules*, 10(6), 1307 (1977), *Chem. & Eng. News*, Nov. 28, p. 31 (1988), JP-A-2-150848 and JP-A-2-296514, sulfonium salts described in J. V. Crivello et al., *Polymer J.*, 17, 73 (1985), U.S. Pat. No. 4,933,377, and German Patent Nos. 3,604,580 and 3,604,581, selenonium salts described in J. V. Crivello et al., *J. Polymer Sci., Polymer Chemich. Ed.*, 17, 1047 (1979), and arsonium salts described in C. S. Wen et al., *Teh, Proc., Conf. Rad. Curing ASIA, Tokyo, October*, p. 478 (1988).

In the present invention, diazonium salts are preferred. Examples of preferred diazonium salts include those described in JP-A-5-158230.

Preferred examples of quinonediazides include o-quinonediazide compounds.

The o-quinonediazide compound for use in the present invention is a compound having at least one o-quinonediazide group, which increases in the alkali solubility by the thermal decomposition, and compounds having various structures may be used. More specifically, the o-quinonediazide has properties such that the capability of inhibiting the dissolution of the binder is lost by the thermal decomposition and the o-quinonediazide itself is changed into an alkali-soluble substance and these two effects favor the solubility of the photosensitive material system. Examples of the o-quinonediazide compound, which can be used in the present invention, include the compounds described in J. Kosar, *Light-Sensitive Systems*, pp. 339–352, John Wiley & Sons. Inc. In particular, sulfonic acid esters or sulfonic acid amides of o-quinonediazide obtained by reacting with an aromatic polyhydroxy or aromatic amino compound of various types are preferred. Also, esters of benzoquinone(1,2)-diazidesulfonic acid chloride or naphthoquinone-(1,2)-diazide-5-sulfonic acid chloride with pyrogallol-acetone resin described in JP-B-43-28403, and esters of benzoquinone-(1,2)-diazidesulfonic acid chloride or naphthoquinone-(1,2)-diazide-5-sulfonic acid chloride with phenol-formaldehyde resin may be suitably used.

Furthermore, esters of naphthoquinone-(1,2)-diazide-4-sulfonic acid chloride with phenolformaldehyde resin or cresol-formaldehyde resin, and esters of naphthoquinone-(1,2)-diazide-4-sulfonic acid chloride with pyrogallol-acetone resin may also be suitably used. Other useful o-quinonediazide compounds are described in a large number of patents and include those described, for example, in JP-A-47-5303, JP-A-48-63802, JP-A-48-63803, JP-A-48-96575, JP-A- 49-38701, JP-A-48-13354, JP-B-41-11222, JP-B-45-9610, JP-B-49-17481, U.S. Pat. Nos. 2,797,213, 3,454,400, 3,544,323, 3,573,917, 3,674,495 and 3,785,825, British Patents 1,227,602, 1,251,345, 1,267,005, 1,329,888 and 1,330,932, and German Patent 854,890.

The amount of onium salt, o-quinonediazide compound, aromatic sulfonic acid ester or the like added is preferably from 0.1 to 50 wt %, more preferably from 0.5 to 30 wt %, still more preferably from 0.5 to 20 wt %, based on all solid contents of the photosensitive composition. These compounds may be used individually or may be used as a mixture of several compounds.

For improving the sensitivity, a general-purpose cyclic acid anhydride other than that represented by formula (I), a phenol, an organic acid or a sulfonyl compound may be used in combination.

Examples of the cyclic acid anhydride which can be used include tetrahydrophthalic acid anhydride, hexahydrophthalic anhydride and succinic acid anhydride described in U.S. Pat. No. 4,115,128.

Examples of the phenols include bisphenol A, p-nitrophenol, p-ethoxyphenol, 2,4',4'-trihydroxybenzophenone, 2,3,4-trihydroxybenzophenone, 4-hydroxybenzophenone, 4,4',4"-trihydroxytriphenylmethane and 4,4',3",4"-tetrahydroxy-3,5,3',5'-tetramethyltriphenylmethane.

Examples of the organic acids include sulfonic acids, sulfinic acids, alkylsulfuric acids, phosphonic acids, phosphoric acid esters and carboxylic acids, described in JP-A-60-88942 and JP-A-2-96755 Specific examples thereof include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, adipic acid, p-toluylic acid, 3,4-dimethoxybenzoic acid, phthalic acid, erucic acid, lauric acid, n-undecanoic acid, ascorbic acid, methylphenylsulfone and diphenyldisulfone.

The ratio of the cyclic acid anhydride, phenol or organic acid occupying in the solid content of photosensitive composition is preferably from 0.05 to 20 wt %, more preferably from 0.1 to 15 wt %, still more preferably from 0.1 to 10 wt %.

The photosensitive composition for use in the present invention may contain a nonionic surface active agent described in JP-A-62-251740 and JP-A-3-208514 or an amphoteric surface active agent described in JP-A-59-121044 and JP-A-4-13149 so as to broaden the processing stability against development conditions.

Specific examples of the nonionic surface active agent include sorbitan tristearate, sorbitan monopalmitate, sorbitan trioleate, stearic acid monoglyceride and polyoxyethylenenonylphenyl ether.

Specific examples of the amphoteric surface active agent include alkyldi(aminoethyl)glycine, alkylpolyaminoethyl glycine hydrochloride, 2-alkyl-N-carboxyethyl-N-hydroxyethylimidazolinium betaine and N-tetradecyl-N,N-betaine type (for example, AMORGEN K, trade name, produced by Daiichi Kogyo K.K.).

The ratio of nonionic surface active agent or amphoteric surface active agent occupying in the solid content of photosensitive composition is preferably from 0.05 to 15 wt %, more preferably from 0.1 to 5 wt %.

The photosensitive composition for use in the present invention may contain a printing out agent for obtaining a visible image immediately after the heating by exposure or a dye or pigment as an image coloring agent A representative example of the printing out agent is a combination of a compound capable of releasing an acid on heating by exposure (photoacid releasing agent) and an organic dye capable of forming a salt.

Specific examples thereof include a combination of o-naphthoquinonediazide-4-sulfonic acid halogenide and a salt-forming organic dye described in JP-A-50-36209 and JP-A-53-8128, and a combination of a trihalomethyl compound and a salt-forming organic dye described in JP-A-53-36223, JP-A-54-74728, JP-A-60-3626, JP-A-61-143748, JP-A-61-151644 and JP-A-63-58440. The trihalomethyl compound includes an oxazole-based compound and a triazine-based compound. Both compounds have excellent aging stability and gives a sharp printed image.

As the image coloring agent, dyes other than the above-described salt-forming organic dyes may also be used. Suitable dyes including the salt-forming organic dye are an oil-soluble dye and a basic dye.

Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all produced by Orient Kagaku Kogyo K.K.), Victoria Pure Blue, Crystal Violet (C.I. 42555), Methyl Violet (C.I. 42535), Ethyl Violet, Rhodamine B (C.I. 45170B), Malachite Green (C.I. 42000) and Methylene Blue (C.I. 52015) Dyes described in JP-A-62-293247 and JP-A-5-313359 are particularly preferred. The dye may be added to the photosensitive composition in a ratio of from 0.01 to 10 wt %, preferably from 0.1 to 3 wt %, based on the solid content of photosensitive composition.

The photosensitive composition for use in the present invention may further contain, if desired, a plasticizer for imparting flexibility to the coated film. Examples thereof include butylphthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomers and polymers of an acrylic acid or methacrylic acid.

In addition, the photosensitive composition for use in the present invention may further contain, if desired, a photo-decomposable compound such as quinonediazides and diazo compounds. The amount of this compound added is preferably from 1 to 5 wt % based on the solid content of photosensitive composition.

Production Method of Photosensitive Layer

The photosensitive layer of the lithographic printing original plate of the present invention may be usually produced by dissolving the above-described components in a solvent and coating the resulting solution on an appropriate support.

Examples of the solvent used here include ethylene dichloride, cyclohexanone, methyl ethyl ketone, methanol, propanol, ethylene glycol monomethyl ether, 2-methoxyethyl acetate, 1-methoxy-2-propyl acetate, dimethoxyethane, ethyl lactate, N,N-dimethylacetamide, N,N-dimethylformamide, tetramethylurea, N-methylpyrrolidone, dimethylsulfoxide γ-butyrolactone and toluene, however, the present invention is by no means limited thereto. These solvents are used individually or in combination.

The concentration of the above-described components (all solids content containing additives) in the solvent is preferably from 1 to 50 wt %. The coated amount (solid content) on the support after the coating and drying varies depending on the use end, however, in the case of a photosensitive printing plate in general, it is preferably from 0.5 to 5.0 g/m$^2$.

For the coating, various methods may be used and examples thereof include bar coater coating, rotation coating, spray coating, curtain coating, dip coating, air knife coating, blade coating and roll coating. As the coated amount is smaller, the apparent sensitivity becomes higher but the film forming property of the photosensitive layer becomes poorer.

The photosensitive layer may contain a surface active agent so as to improve the coatability, such as a fluorine-based surface active agent described, for example, in JP-A-62-170950. The amount of the surface active agent added is preferably from 0.01 to 1 wt %, more preferably from 0.05 to 0.5 wt %, based on all solids content of the photosensitive layer.

[Support]

For the support used, a dimensionally stable, plate-like material may be used. Examples thereof include those described above.

As the support, polyester film and aluminum sheet are preferred, and aluminum sheet is more preferred because it is dimensionally stable and relatively inexpensive. The aluminum sheet is suitably a pure aluminum sheet or an alloy sheet mainly comprising aluminum and containing a trace amount of foreign elements. Also, a plastic film laminated with or having deposited thereon aluminum may be used. Examples of the foreign element contained in the aluminum alloy include silicon, iron, manganese, copper, magnesium, chromium, zinc, bismuth, nickel and titanium. The foreign element content in the alloy is at most 10 wt % or less. In the present invention, pure aluminum is preferred, however, it is difficult to produce a completely pure aluminum in view of the smelting technology and therefore, an aluminum containing a trace amount of foreign elements may be used. As such, the composition of the aluminum sheet for use in the present invention is not specified and an aluminum sheet comprising conventionally known materials may be appropriately used.

The aluminum sheet as a substrate for use in the present invention preferably has a thickness of approximately from 0.1 to 0.6 mm, more preferably from 0.15 to 0.4 mm, still more preferably from 0.2 to 0.3 mm.

In advance of surface-roughening the aluminum sheet, the aluminum sheet is, if desired, subjected to a degreasing treatment with, for example, a surface active agent, an organic solvent or an alkaline aqueous solution so as to remove the rolling oil on the surface.

The surface roughening (e.g., graining) of the aluminum sheet is performed by various methods, for example, by a method of mechanically roughening the surface, a method of electrochemically dissolving and roughening the surface or a method of chemically dissolving the selected surface. In the mechanical surface roughening, a known method such as ball polishing, brush polishing, blast polishing or buff polishing may be used. The electrochemical surface roughening may be performed by passing an alternating current or direct current through the electrolytic solution such as hydrochloric acid or nitric acid. These two surface roughening treatments may be used in combination as disclosed in JP-A-54-63902.

The thus surface roughened aluminum sheet is, if desired, subjected to alkali etching and neutralization and further, if desired, to anodic oxidation so as to increase the water receptivity or abrasion resistance on the surface. As the electrolyte for use in the anodic oxidation of aluminum sheet, various electrolyte capable of forming a porous oxidation film may be used and in general, phosphoric acid, oxalic acid, chromic acid or a mixed acid thereof is used. The concentration of the electrolyte is appropriately selected according to the king of the electrolyte.

The treating conditions in the anodic oxidation vary depending on the electrolyte used and cannot be indiscriminately specified, however, the conditions in general are properly such that the concentration of the electrolyte (solution) is from 1 to 80 wt %, the liquid temperature is from 5 to 70° C., the current density is from 5 to 60 A/dm$^2$, the voltage is from 1 to 100 V, and the electrolysis time is from 10 seconds to 5 minutes.

If the amount of anodic oxidation film is less than 1.0 g/m$^2$, a sufficiently long press life may not be obtained or the non-image area of the lithographic printing plate is readily scratched and so-called "scratch scumming" of allowing ink to adhere to the scratch part is liable to occur at the time of printing.

After the anodic oxidation, the aluminum surface is, if desired, subjected to hydrophilization. As the hydrophilization treatment, an alkali metal silicate (for example, an aqueous sodium silicate solution) method disclosed in U.S. Pat. Nos. 2,714,066, 3,181,461, 3,280,734 and 3,902,734 is known. According to this method, the support is dipped or electrolyzed in an aqueous sodium silicate solution. In addition, a method of treating the support with potassium fluorozirconate disclosed in JP-B-36-22063 or with polyvinylphosphonic acid disclosed in U.S. Pat. Nos. 3,276,868, 4,153,461 and 4,689,272 may be used.

(Other Layers)

The lithographic printing original plate of the present invention comprises a support having provided thereon a photosensitive layer formed by coating an infrared laser-use positive photosensitive composition. If desired, an undercoat layer may be provided between the support and the photosensitive layer.

For the component of the undercoat layer, various organic compounds may be used. Examples thereof include carboxymethyl cellulose, dextrin, gum arabi, phosphonic acids having an amino group, such as 2-aminoethylphosphonic acid, organic phosphonic acids such as phenylphosphonic acid which may have a substituent, naphthylphosphonic acid, alkylphosphonic acid, glycerophosphonic acid, methylenediphosphonic acid and ethylenediphosphonic acid, organic phosphoric acids such as phenylphosphoric acid which may have a substituent, naphthylphosphoric acid, alkylphosphoric acid and glycerophosphoric acid, organic phosphinic acids such as phenylphosphinic acid which may have a substituent, naphthylphosphinic acid, alkylphosphinic acid and glycerophosphinic acid, amino acids such as glycine and β-alanine, and hydrochlorides of amine having a hydroxy group, such as triethanolamine hydrochloride. These may be used either individually or in combination of two or more thereof.

The coverage of the organic undercoat layer is suitably from 2 to 200 mg/m$^2$, preferably from 5 to 100 mg/m$^2$. If this coverage is less than 2 mg/m$^2$, a sufficiently long press life may not be obtained. The same goes for the case where the coverage exceeds 200 mg/m$^2$.

In the lithographic printing original plate of the present invention, an overcoat layer may be provided on the photosensitive layer, if desired. Examples of the component for the overcoat layer include polyvinyl alcohol, methacrylate, acrylate and matting materials used in the ordinary photosensitive lithographic printing original plate.

[Exposure Step]

The thus-manufactured lithographic printing original plate is subjected to exposure in an appropriate heat mode, preferably exposure by an infrared laser, and development with an alkali development processing solution, thereby accomplishing the plate making.

The photosensitive layer according to the present invention is advantageous in that a positive image can be formed using an infrared laser. Accordingly, the light source of emitting an active ray used for the imagewise exposure in the exposure step (imagewise exposure step) is preferably a light source having a light emitting wavelength of 700 nm or more in the region of from a far infrared to an infrared. To speak specifically, the light source for use in the plate-making method of the present invention is preferably a solid laser capable of irradiating an infrared ray having a light emitting wavelength of from 700 to 1,200 nm, more preferably a semiconductor laser.

The lithographic printing original plate may also be exposed using a heat mode-type light source other than the infrared laser For example, high-illuminance xenon flash light capable of acting as a heat ray, xenon arc light, light of tungsten halogen lamp or a laser light oscillating a wavelength in the visible region may be used.

[Development Step]

The development step of the photosensitive lithographic printing original plate of the present invention is described in detail below in the order of developer, replenishing method and developing apparatus.

(Developer)

The development processing solution (called developer) to which the development processing method of the present invention can be applied is preferably a developer having a pH of from 9.0 to 14.0, more preferably from 12.0 to 13.5. Unless otherwise indicated, the developer referred to in the present specification means both the developer in the state of a use solution filled in the developing tank and the development replenisher.

As the developer for use in the above-described development processing, a conventionally well-known alkali aqueous solution described above may be used.

Among the alkali aqueous solutions, the developers capable of more successfully bringing out the effect of the present invention are so-called "silicate developer" which is an aqueous solution having a pH of 12 or more and containing alkali silicate as a base or alkali silicate obtained by mixing a silicon compound with a base, and so-called "non-silicate developer" not containing alkali silicate and containing a non-reducing sugar and a base.

In the former case, the aqueous solution of alkali metal silicate can be controlled in the developability by the ratio of silicone oxide $SiO_2$ as a component of the silicate to the alkali metal oxide $M_2O$ (the ratio is generally expressed by the molar ratio of $[SiO_2]/[M_2O]$), and the concentrations thereof. This aqueous solution may be used at a ratio and concentrations described above of respective components.

The so-called "non-silicate developer" not containing alkali silicate and containing a non-reducing sugar and a base is also preferably used in the developing method of the present invention. When the photosensitive lithographic printing original plate is developed using this developer, the surface of the photosensitive layer can be prevented from deteriorating and at the same time, the photosensitive layer can maintain its good inking state. In general, the photosensitive lithographic printing original plate has a narrow development latitude and the line image width or the like greatly varies depending on the pH of developer. The non-silicate developer contains a non-reducing sugar having a buffering property of suppressing the fluctuation of pH, therefore, this developer is advantageous as compared with the developer containing silicate Furthermore, the non-silicate developer is advantageous also in the point that the non-reducing sugar hardly contaminates the electroconductivity sensor or pH sensor for controlling the degree of liquid activity as compared with silicate. In other words, the silicate developer and the non-silicate developer respectively have advantageous points and can be preferably used in the present invention.

The non-reducing sugar is a sugar not containing a free aldehyde or ketone group and not exhibiting reducing property. The non-reducing sugar is classified into trehalose-type oligosaccharide where reducing groups are bonded to each other, glycoside where a reducing group of the sugar and a non-sugar are bonded, and sugar-alcohol obtained by hydrogenating and thereby reducing a sugar. These all are suitably used in the present invention. In the present invention, the non-reducing sugars described in JP-A-8-305039 are preferred.

Examples of the trehalose-type oligosaccharide include saccharose and trehalose.

Examples of the glycoside include alkyl glycoside, phenol glycoside and mustard oil glycoside.

Examples of the sugar-alcohol include D,L-arabitol, ribitol, xylitol, D,L-sorbitol, D,L-mannitol, D,L-iditol, D,L-talitol, dulcitol and allodulcitol. In addition, maltitol resulting from the hydrogenation of maltose as a disaccharide and a reduction product (reduced starch syrup) obtained by the hydrogenation of oligosaccharide may be suitably used.

Among these non-reducing sugars, trehalose-type oligosaccharide and sugar-alcohol are preferred, and D-sorbitol, saccharose, reduced starch syrup are more preferred because these have a buffering action in a proper pH region and cost low.

In the present invention these non-reducing sugars may be used either individually or in combination of two or more thereof.

The content of the non-reducing sugar in the non-silicate developer is preferably from 0.1 to 30 wt %, more preferably from 1 to 20 wt %. If this content is less than 0.1 wt %, a sufficiently high buffering action may not be obtained, whereas if it exceeds 30 wt %, a high concentration may not be obtained and there arises a problem of increase in the cost.

Examples of the base used in combination with the non-reducing sugar include conventionally known alkali agents such as inorganic alkali agents and organic alkali agents.

Examples of the inorganic alkali agent include sodium hydroxide, potassium hydroxide, lithium hydroxide, trisodium phosphate, tripotassium phosphate, triammonium phosphate, disodium phosphate, dipotassium phosphate, diammonium phosphate, sodium carbonate, potassium carbonate, ammonium carbonate, sodium hydrogencarbonate, potassium hydrogencarbonate, ammonium hydrogencarbonate, sodium borate, potassium borate and ammonium borate.

Examples of the organic alkali agent include monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine.

These bases may be used either individually or in combination of two or more thereof. Among these bases, sodium hydroxide and potassium hydroxide are preferred because the pH can be adjusted in a wide pH region by controlling the amount thereof. Furthermore, trisodium phosphate, tripotassium phosphate, sodium carbonate and potassium carbonate are also preferred because these have a buffering action by themselves.

The content of the base used here in the non-silicate developer is appropriately selected by taking account of the desired pH and the kind and added amount of the non-reducing sugar.

The use of a reducing sugar in combination with the base is disadvantageous in the present invention because the reducing sugar is browned, the pH gradually lowers and the developability decreases.

In the present invention, a non-silicate developer mainly comprising an alkali metal salt of the non-reducing sugar in place of the combination of a non-reducing sugar and a base, may be used.

The alkali metal salt of the non-reducing sugar may be obtained by mixing the non-reducing sugar with an alkali metal hydroxide, heating and thereby dehydrating the mixture at a melting point or more of the non-reducing sugar or by drying an aqueous solution of a mixture of the non-reducing sugar and an alkali metal hydroxide.

In the non-silicate developer for use in the present invention, an alkaline buffer solution comprising a weak acid other than the above-described non-reducing sugar and a strong base may be used in combination.

The weak acid preferably has a dissociation constant (pKa) of from 10.0 to 13.2 and may be selected from those described, for example, in *Ionization Constants of Organic Acids in Aqueous Solution,* Pergmon Press.

Specific examples of the weak acid, which can be suitably used, include alcohols such as 2,2,3,3-tetrafluoropropanol-1 (pKa: 12.74), trifluoroethanol (pKa: 12.37) and trichloroethanol (pKa: 12.24); aldehydes such as pyridine-2-aldehyde (pKa: 12.68) and pyridine-4-aldehyde (pKa: 12.05); compounds having a phenolic hydroxide, such as salicylic acid (pKa: 13.0), 3-hydroxy-2-naphthoic acid (pKa: 12.84), catechol (pKa: 12.6), gallic acid (pKa: 12.4), sulfosalicylic acid (pKa: 11.7), 3,4-dihydroxysulfonic acid (pKa: 12.2), 3,4-dihydroxybenzoic acid (pKa: 11.94), 1,2,4-trihydroxybenzene (pKa: 11.82), hydroquinone (pKa: 11.56), pyrogallol (pKa: 11.34), o-cresol (pKa: 10.33), resorcinol (pKa: 11.27), p-cresol (pKa: 10.27) and m-cresol (pKa: 10.09); oximes such as 2-butanoneoxime (pKa: 12.45), acetoxime (pKa: 12.42), 1,2-cycloheptanedionedioxime (pKa: 12.3), 2-hydroxybenzaldehydeoxime (pKa: 12.10), dimethylglyoxime (pKa: 11.9), ethanediamidedioxime (pKa: 11.37), acetophenoneoxime (pKa: 11.35); nucleic acid related substances such as adenosine (pKa: 12.56), inosine (pKa: 12.5), guanine (pKa: 12.3), cytosine (pKa: 12.2), hypoxanthine (pKa: 12.1) and xanthine (pKa: 11.9); and additionally dimethylaminomethylphosphonic acid (pKa: 12.32), 1-amino-3,3,3-trifluorobenzoic acid (pKa: 12.29), isopropylidenediphosphonic acid (pKa: 12.10), 1,1-ethylidenediphosphonic acid (pKa: 11.54), 1,1-ethylidenediphosphonic acid 1-hydroxy (pKa: 11.52), benzimidazole (pKa: 12.86), thiobenzamide (pKa: 12.8), picolinethioamide (pKa: 12.55) and barbituric acid (pKa: 12.5). Among these, sulfosalicylic acid and salicylic acid are preferred.

Examples of the strong base used in combination with this weak acid, which can be suitably used, include sodium hydroxide, ammonium hydroxide, potassium hydroxide and lithium hydroxide.

These strong bases may be used either individually or in combination of two or more thereof. The strong base is used after adjusting the pH to fall within a preferred range by appropriately selecting the concentration and the combination.

In the present invention, the processing is preferably performed under a so-called over-condition where the alkali concentration of the alkali development processing solution is increased so as to improve the developability, and this over-condition can be attained by controlling the amount of the base added. More specifically, the over-condition may be attained by adding the base to the alkali development processing solution so that the alkali development processing can have strong alkalinity, for example, the pH can fall within the range of from 12.5 to 13.5, preferably from 12.8 to 13.3.

The developer may contain a surface active agent or organic solvent of various types, if desired, for the purpose of accelerating the developability, dispersing the development residue and increasing the ??ink receptivity in the image area of printing plate. Preferred examples of the surface active agent include anionic, cationic, nonionic and amphoteric surface active agents. The surface active agents may be used either individually or in combination of two or more thereof and the surface active agent is added to the developer in an amount of from 0.001 to 10 wt %, preferably from 0.01 to 5 wt %.

If desired, an organic solvent described above is added to the developer in an amount also-described above.

The developer may further contain, if desired, an antiseptic, a coloring agent, a thickener, a defoaming agent and a hard water-softening agent, as described above.

The proper amount of the hard water softening agent added varies depending on the chelating ability thereof, the hardness of hard water used, and the amount of the hard water, however, the hard water softening agent is preferably used in an amount described above.

(Replenishment)

At the time of developing a photosensitive printing original plate, a replenishment is performed for compensating the consumption of developer components or dissolution of the original plate composition occurring with the development reaction, or the change in the developer composition due to contact with air during the storage aging before the use in the development of the original plate. In an ordinary development processing, the pH of developer is a representative property commonly used as an index in the implementation of replenishment. The replenishment is performed to keep the pH value constant or performed to increase the replenishing amount to a level where the control of replenishment using the representative property as an index is not necessary. However, in the latter method, the amount of the development waste solution discharged increases. The former method is disadvantageous for the heat-mode type photosensitive lithographic printing original plate of the present invention, because the pH greatly changes not in correspondence with the photographic performance as described above. To cope with these problems, in the present invention, the developer is activated by the replenishment such that a current is passed between electrodes through the developer and thereby hydroxy ion is supplied.

In the present invention, the supply of hydroxy ion by the current-carrying is preferably performed according to the exhaustion of developer. Accordingly, detection means capable of correctly reflecting the degree of exhaustion and not relying on the pH is necessary. The present invention has been accomplished based on the finding of such detection means.

The preferred detection means for detecting the exhaustion of developer, which is a main feature of the present invention, include three means described below.

(1) Reading of Processed Area of Photosensitive Lithographic Printing Original Plate For example, when a photosensitive lithographic printing original plate is exposed, Components (A), (B) and (C) are dissolved in the developer and thereby alkali is consumed. In a developer system having poor buffering ability, the relationship between the alkali consumption and the pH change is not simply fixed but the amount of the photosensitive material processed corresponds to the amount of alkali agent consumed during the development and moreover, can serve as an index capable of correctly reading the consumption. Accordingly, by using the processed amount of the photosensitive material as an index, the degree of exhaustion of the developer can be correctly detected.

(2) Integration of Intervals where Development is not Performed in Development Processing Apparatus The developer of the photosensitive lithographic printing original plate is usually highly alkaline with a pH of 12 or more, mostly 12.5 or more, and at the same time low in the concentration of salts, therefore, absorbs carbon dioxide gas in air at a high rate. The development activity acutely responds to the amount of carbon dioxide absorbed and decreases. Accordingly, in proportion with the interval where the development processing is not performed in the development processing solution, the deterioration in aging of the developer due to carbon dioxide gas proceeds. Under such conditions, combined with the low salts concentration and high hydroxy ion concentration of the developer, the pH value cannot serve as an index for the aging deterioration ascribable to the absorption of carbon dioxide gas but the integrated time of intervals where the development processing is not performed can serve as an index for use in the control of the amount of alkali supplied, namely, means for appropriately detecting the degree of exhaustion. The term "interval where the development is not performed" as used herein means a sum of two cases; one is in the state where the power source of the development processing apparatus is turned on, the temperature and the replenishing system are ready and the development can start on feeding of a photosensitive lithographic printing original plate material, namely, a so-called stand-by state, and another is in the dead state where the power source of the development processing apparatus is turned off. The carbon dioxide gas absorbing rate does not differ so largely between the stand-bay state and the dead state where neither the temperature control nor the stirring of developer is done, therefore, even when intervals of two cases are integrated while neglecting the slight difference therebetween, the precision in the control of developer is not greatly affected.

The degree of exhaustion of the developer occurring with the development is detected by the method in (1) above and the degree of exhaustion of the developer occurring with the aging of the developer where the development processing is not performed is detected by the method in (2) above. The degree of exhaustion of the developer occurring with development and aging (stand-by and dead of apparatus) may also be detected by the method (3) described below.

(3) Detection of Degree of Exhaustion by Physical Property Value other than pH Value As the physical detection means, physical property values other than pH value can be used. In the developer for photosensitive lithographic printing original plates, the alkali component is consumed by the development and this must appear as the decrease of hydroxy ion, namely, pH, the decrease of electroconductivity, the increase of specific gravity and the increase of opacity. However, as repeatedly described above, the pH value does not correctly reflect the exhaustion of developer due to various combined factors, whereas physical property values other than pH respond in correspondence to the exhaustion and can be used as the means for detecting the degree of exhaustion. The physical property values preferably used to this purpose are electric conductivity (hereinafter referred to as "electroconductivity"), specific gravity and opacity. Among these, the electroconductivity unexpectedly well reflects the exhaustion. The conditions of high alkali concentration and low salts concentration seem to be advantageous for the detection means because the hydroxy ion can greatly contributes to the electroconductivity and the concentration thereof nearly corresponds to the electroconductivity. The method is superior to the methods (1) and (2) in that the degree of exhaustion of the developer can be directly read irrespective of the kind of the photosensitive lithographic printing original plate under the development processing or the difference at the storage aging after the production.

The exhaustion of developer is brought about by both the processing exhaustion occurring with the processing of a photosensitive lithographic printing original plate and the aging exhaustion due to absorption of carbon dioxide gas in the environment in the state where the development is not performed. Therefore, by determining the degree of exhaustion using in combination the processed area of a photosensitive lithographic printing original plate and the integrated time of aging intervals in the state where the development is not performed, including the stand-by state, the precision in the feeding of alkali can be more improved.

As the electrolytic solution used for passing a current and thereby feeding alkali, an aqueous solution of salts may be prepared separately from the developer. However, at least with respect to the cathode solution, use of the developer actually used is particularly advantageous because the preparation of electrolytic solution is not necessary (or the amount of the electrolytic solution can be greatly reduced) and since the current-carrying tank can be directly connected to the developer bath, the solution may be used in circulation by introducing the exhausted developer into the current-carrying tank and activating the developer in the current-carrying tank. In this development processing method, the amount of developer discharged as the waste solution after the use in the development can be greatly reduced within the range of not causing precipitation of organic materials (e.g., polymer compound) dissolved out in the developer.

During the passing of a current, hydroxy ion is generated in the cathode chamber and the developer is activated. At the same time, in the anode chamber, hydrogen ion is produced and this hydrogen ion can also be used in the development. More specifically, as described later, the hydrogen ion may be used for accelerating the water washing in the water washing step subsequent to the development of a photosensitive lithographic printing original plate or may be used for the neutralization operation as a preparatory treatment before the discharge of the developer waste solution.

The problems relating to the stability in the development of a photosensitive lithographic printing original plate can be solved as follows by the passing of a current through the developer and the activation of the developer brought about thereby:

(1) the amounts of chemicals used as the developer components can be reduced and the amount of waste solution discharged can be reduced;

(2) the feeding of alkali can be controlled by a proper index, the development quality can be maintained and the operation can be stably performed while preventing the dissolved components from precipitating in the developer circulating system; and (3) in the case where the anode solution is used for the replenisher in the water washing, particularly low replenishing water washing, the relief image in the non-dissolving out region can be increased in the strength.

Also, the effect on the exhaustion of developer by the reduction in the developability due to the storage aging of the photosensitive lithographic printing original plate can be diminished.

With respect to the above-described organic contamination, namely, poisoning of electrodes, the method of the present invention can be free of any deterioration in the electrolytic efficiency due to poisoning. This unexpected effect is considered to result because the developer in the developing tank is stabilized in the method of the present invention where the feeding of alkali is controlled by a proper index.

With respect to the form in using the hydroxy ion obtained by passing a current between electrodes through the developer for the replenishment as an alkali component, any method such as (1) a method of introducing the developer underwent the current-carrying in the cathode chamber into the replenishing tank, (2) a method of replenishing the solution underwent the current-carrying in the cathode chamber to the developing tank and (3) a method of replenishing the solution underwent the current-carrying in the cathode chamber to the circulation route of the developing tank, may be used. Among these, the form of (3) is preferred.

(Development Processing Apparatus)

The apparatus described above may be used in the same manner.

[Plate-Making Step Subsequent to Development]

The printing original plate after the development is subjected to an after-treatment with washing water, a rinse containing a surface active agent and the like, or a desensitizing solution containing gum arabi or a starch derivative, as described in JP-A-54-8002, JP-A-55-115045 and JP-A-59-58431. In the processing apparatus for use in the present invention, these processing operations may be performed by variously combining them.

The lithographic printing plate obtained through these processing operations is mounted on an offset printer and used for printing a large number of sheets.

As the plate cleaner used for removing scumming on the plate at the printing, a conventionally well-known plate cleaner for PS plates may be used and examples thereof include CL-1, CL-2, CP, CN-4, CN, CG-1, PC-1, SR and IC [all produced by Fuji Photo Film Co., Ltd.].

The thus-obtained lithographic printing plate which is if desired subjected to washing with washing water or a rinse containing a surface active agent or the like and then coating with gum arabi or a desensitizing gum containing a starch derivative, may be transferred to a printing step, however, for obtaining a lithographic printing plate having further longer press life, the plate is subjected to a burning treatment.

In the case where the lithographic printing plate is burned, the plate is preferably treated with a plate burning conditioner described in JP-B-61-2518, JP-B-55-28062, JP-A-62-31859, JP-A-61-159655 before the burning treatment.

The treatment with a plate burning conditioner may be performed by a method of coating the plate burning conditioner on the lithographic printing plate by means of sponge or absorbent cotton impregnated with the solution, a method of dipping the printing plate in a vat filled with the plate burning conditioner and thereby coating the solution, or the coating using an automatic coater. After the coating, when the coated amount is homogenized by a squeegee or a squeegee roller, more preferred results may be obtained.

In general, the amount of the plate burning conditioner coated is suitably from 0.03 to 0.8 g/m$^2$ (dry weight). After the coating of the plate burning conditioner, the lithographic printing plate is, if desired dried and then heated at a high temperature by a burning processor (for example, a burning processor "BP-1300", available from Fuji Photo Film Co., Ltd.). In this case, the heating temperature and time vary depending on the kind of components constituting the image, however, the heating is preferably performed at from 180 to 300° C. for from 1 to 20 minutes.

If desired, the burned lithographic printing plate may be appropriately subjected to conventional treatments such as water washing and gumming, however, in the case where a plate burning conditioner containing a water-soluble polymer compound or the like is used, a so-called desensitizing treatment such as gumming may be dispensed with.

The lithographic printing plate obtained through these processing operations is mounted on an offset printer and used for printing a large number of sheets.

EXAMPLES

The embodiments and effects of the present invention are described in greater detail below by referring to the Examples, however, the present invention should not be construed as being limited thereto.

Example I

In the Examples below, a plate-making material "VS" (manufactured by Fuji Photo Film Co., Ltd.) for manufacturing an offset printing PS plate comprising an anodized aluminum support was used as the material having a photosensitive resin composition.

The exposure performed was a sensitometry exposure using an optical wedge having a step difference of 0.2 by a xenon arc discharge lamp (in which an ultraviolet filter such as soda glass was disengaged) of 2,500 W having a continuous spectrum, according to JIS Z8902. This discharge lamp was a quartz glass tube and the ultraviolet ray component was not absorbed by the tube wall.

An alkali development processing solution for use in the development processing step was prepared as follows.
(Preparation of Alkali Development Processing Solution)
Formulation of Alkali Development Processing Solution

| Potassium hydroxide | 2.4 wt % |
|---|---|
| Silicon dioxide | 1.8 wt % |
| Nonionic surface active agent | 0.8 wt % |
| (PEG-1000, produced by Wako Junyaku) | |
| Potassium citrate | 3.0 wt % |
| Water | 92.0 wt % |

The developer had a pH of 13.03 and an electroconductivity of 49,500 μs/cm.

The development processing apparatus used was a commercially available development processing apparatus for PS plates, to which an electrolytic device shown in FIG. 1 with a control part (16 in FIG. 1) was connected. This development processing apparatus had a developing tank, a water washing tank and a desensitization treatment tank each in a dipping-in-bath system, in which the processing time in respective steps was 15 seconds, 10 seconds and 10 seconds in the order described above.

A test was performed as follows using the PS plate material, the sensitometry exposure method, the developer and the development processing apparatus, which are described above.

The development results were evaluated by the developed optical wedge image as follows. That is, the numerical value at the step number where the composition was recognized as not dissolved but remaining was taken as a standard sensitivity of 0, the step number deviated from the standard was calculated in terms of the step difference and shown by taking the deviation of one step as 0.2. When the step number was shifted to the high sensitivity side, the sensitivity value was affixed with "+", whereas it was shifted to the lower sensitivity side, the sensitivity value was affixed with "−". Hereinafter, the sensitivity shown as such is called a relative optical wedge sensitivity.

Example I-1

In this Example, the degree of exhaustion of the developer due to the development processing was obtained by the processed amount in the development determined by the development processed amount-integrating unit furnished to the development processing apparatus.

The entire system was designed such that a voltage was applied to the electrodes based on the signals sent from the control part (16 in FIG. 1) appending to the electrolytic cell every each time when 3 m$^2$ (varied depending on the kind of the photosensitive resin composition) of a PS plate sample was developed, to perform electrolysis at a current density of 5 A/dm$^2$ and a current value of 15 A for 2 minutes (quantity of current-carrying: 1,800 coulomb) and then the circuit was closed.

Every each time when development of 15 m$^2$ was performed in this apparatus, the developed sample for evaluation was taken out. The development processing was performed until the total processed amount reached 60 m$^2$.

The relative optical wedge sensitivity was less than 0.2 of the standard sensitivity from the start of development through the end, namely, the step number of the sensitivity point was the same as the step number of the sample subjected to the standard development. In other words, during the development processing of PS plate sample as much as 60 m², the sensitivity was maintained constant in the method of the present invention. Moreover, precipitates were not observed in the developer.

Example I-2

In this Example, the degree of exhaustion of the developer in the intervals where the development processing apparatus was in the dead time was obtained by the integrated dead intervals determined by the dead time-integrating unit furnished to the development processing apparatus, and the control of developer was performed by the electrolytic device based on the value obtained.

The development processing apparatus was turned off and laid in the dead state for 2 days without performing the development of a PS plate sample. The entire system was designed such that a voltage was applied to the electrodes based on the signals sent from the control part (16 in FIG. 1) appending to the electrolytic cell every each time when the dead interval reached 5 hours, to perform electrolysis at a current density of 5 A/dm² and a current value of 15 A for 2 minutes (quantity of current-carrying: 1,800 coulomb) and then the circuit was closed.

After developing a PS plate sample as a control, the apparatus was left standing for 2 days. Thereafter, without newly adjusting the developer in the developing tank, a PS plate sample of the same lot was immediately developed. These two samples were compared.

In both samples, the relative optical wedge sensitivity was less than 0.2 of the standard sensitivity, namely, the step number of the sensitivity point was the same.

Example I-3

In this Example, the degree of exhaustion of the developer due to the development processing was obtained by the electroconductivity value of developer determined by the electroconductivity meter furnished to the developing tank of the development processing apparatus.

The entire system was designed such that a voltage was applied to the electrodes based on the signals sent from the control part (16 in FIG. 1) appending to the electrolytic cell every each time when the electroconductivity was changed (reduced) by 495 µs/cm along with the development of a PS plate sample, to perform electrolysis at a current density of 5 A/dm² and a current value of 15 A for 2 minutes (quantity of current-carrying: 1,800 coulomb) and then the circuit was closed. During this operation, if the change in the electroconductivity was not recovered to 495 µs/cm or less of the electroconductivity of the initial developer, a voltage was automatically further applied every 2 minutes.

Every each time when development of 15 m² was performed in this apparatus, the sample subjected to optical wedge exposure for evaluation was taken out. The development processing was performed until the total processed amount reached 60 m².

The relative optical wedge sensitivity was less than 0.2 of the standard sensitivity from the start of development through the end, namely, the step number of the sensitivity point was the same as the step number of the sample subjected to the standard development. Moreover, precipitation of dissolved components was not observed.

Example I-4

In this Example, an embodiment of performing the development processing of a material having a photosensitive resin composition of the present invention using an apparatus where an electrolytic device and a development processing device were integrated, is described.

Figure 2:
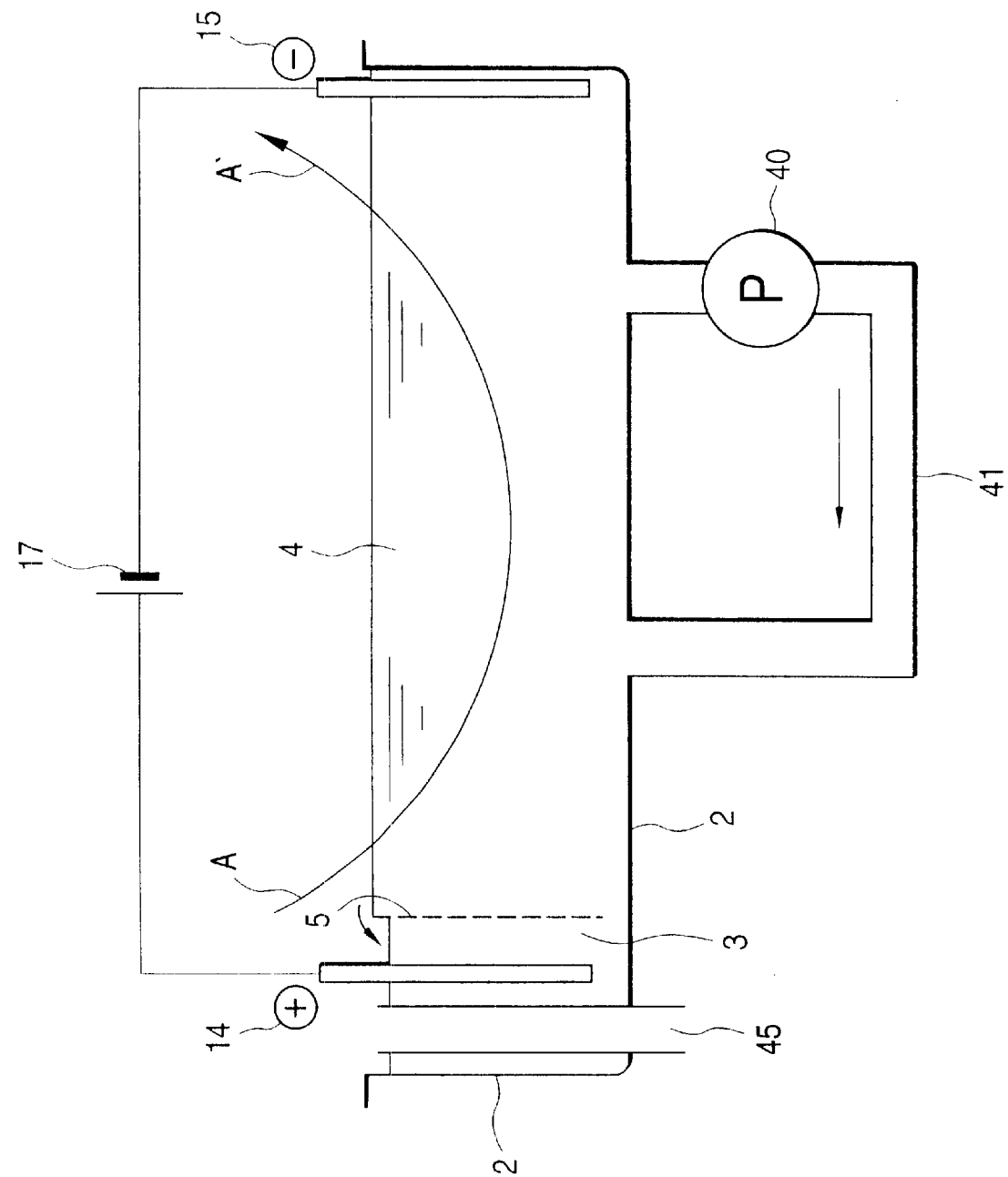
FIG. 2 is a schematic view showing an apparatus where an electrolytic device and a development processing device are integrated, for use in one embodiment of the present invention.
Figure 3:
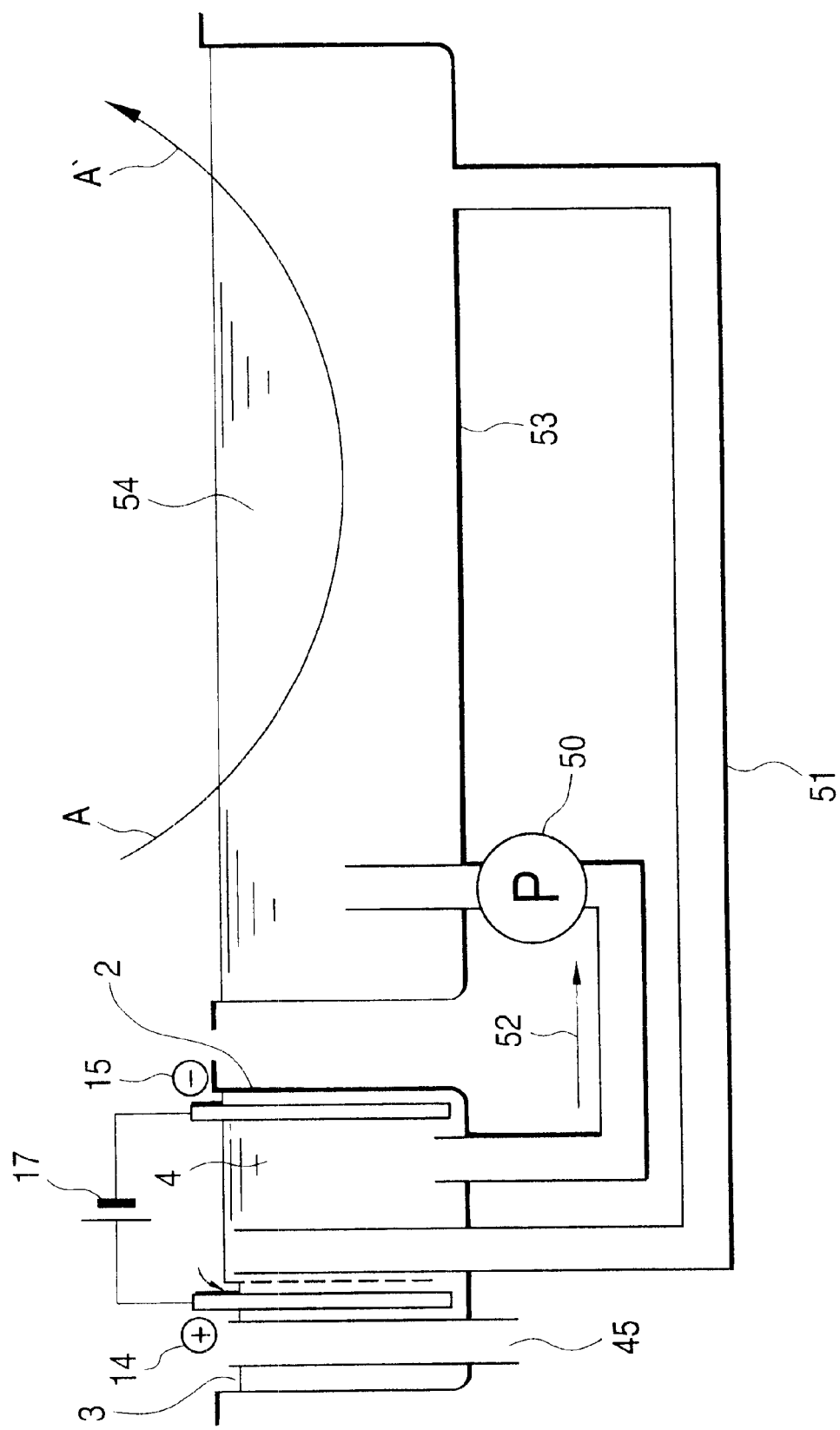
FIG. 3 is a schematic view showing a development processing apparatus where an electrolytic device is integrated, for use in one embodiment of the present invention.

FIG. 2 is a view showing an apparatus for use in the present invention, where an electrolytic device and a development processing device are integrated. In FIG. 1 through FIG. 3, the same number is used for the same part. The cathode chamber 4 of the electrolytic unit 2 concurrently serves as a development processing tank. The structure is designed such that the developer filled in the tank is at the same time a cathode solution and takes part in the reaction of producing hydroxy ion as a result of reduction of water by the cathode 15 while developing the photosensitive resin composition under transportation through the transportation route shown by the arrow A–A', so that the consumption of hydroxy ion due to the development can be compensated for by the production in the cathode. The anode chamber 3 is separated from the cathode chamber by the diaphragm 5 and the cathode solution flows over the upper portion of the diaphragm playing a weir into the anode chamber and is oxidized by electrolysis. As a result, electrolytic oxidation of organic components and generation of hydrogen ion take place and in turn the pH decreases. The anode solution is discharged as a development waste solution from the electrolytic unit through the discharge port 45. On the other hand, the developer in the cathode chamber 4 is circulated with stirring through the circulation route 41 by the circulating pump 40, whereby the temperature is controlled and the developer is stirred.

In this Example, a photosensitive resin composition (a plate-making material "VS" for manufacturing an offset printing PS plate) was developed thoroughly in the same manner as in the development processing of Example I-3 except for using the apparatus shown in FIG. 2. Every each time when development of 15 m² was performed in this apparatus, the sample subjected to optical wedge exposure for evaluation was taken out. The development processing was performed until the total processed amount reached 60 m². The relative optical wedge sensitivity was less than 0.2 of the standard sensitivity from the start of development through the end, namely, the step number of the sensitivity point was the same as the step number of the sample subjected to the standard development. Moreover, precipitation of dissolved components was not observed.

Example I-5

In this Example, one embodiment of performing the development processing of a material having a photosensitive resin composition of the present invention using an apparatus for use in the present invention, where the cathode solution in the electrolytic device and the developer in the development processing apparatus form a circulation system, is described.

FIG. 3 is a schematic view showing a development processing apparatus having integrated therein an electrolytic device, where the cathode chamber in the electrolytic cell and the developing tank in the development processing apparatus form a circulation system. The cathode chamber 4 of the electrolytic cell forms a circulation system together with a developing tank 54 of the development tank apparatus 53 using a liquid transfer line 51, a liquid transfer line 52 and a circulating pump 50. The developer activated by the hydroxy ion generated on the electrolysis in the cathode chamber is allowed to flow into the developing tank by the circulating pump 50. This developer develops the photosensitive resin composition under transportation through the transportation route shown by the arrow A–A'. In this way, the consumption of hydroxy ion due to the development can be compensated for by the production in the cathode. The anode chamber 3 is separated from the cathode chamber by the diaphragm 5 and the cathode solution flows over the upper portion of the diaphragm playing a weir into the anode chamber and is oxidized by electrolysis. As a result, electrolytic oxidation of organic components and generation of hydrogen ion take place and in turn the pH decreases. The anode solution is discharged as a development waste solution from the electrolytic unit through the discharge port 45.

In this Example, a photosensitive resin composition (a plate-making material "VS" for manufacturing an offset printing PS plate) was developed thoroughly in the same manner as in the development processing of Example I-3 except for using the apparatus shown in FIG. 3. Every each time when development of 15 m² was performed in this apparatus, the sample subjected to optical wedge exposure for evaluation was taken out. The development processing was performed until the total processed amount reached 60 m². The relative optical wedge sensitivity was less than 0.2 of the standard sensitivity from the start of development through the end, namely, the step number of the sensitivity point was the same as the step number of the sample subjected to the standard development. Moreover, precipitation of dissolved components was not observed.

In the method of the present invention for developing a material having a photosensitive resin composition, the degree of exhaustion of the development processing solution is detected and according to the degree, water is electrolyzed and the replenishment of the developer is controlled, so that the amount of the development replenisher and in turn the amount of the development waste solution can be reduced and moreover, the development processing quality can be stably kept while causing no precipitation of insoluble matters in the developer and maintaining the sensitivity of the material having a photosensitive resin composition.

Example II

Other embodiments are described below by referring to the Examples.

[Preparation of Photosensitive Lithographic Printing Original Plate Sample]

(Production of Alkali-Soluble Polymer Compound)

In a 500 ml-volume three-necked flask equipped with a stirrer, a condenser and a dropping funnel, 31.0 g (0.36 mol) of methacrylic acid, 39.1 g (0.36 mol) of ethyl chloroformate and 200 ml of acetonitrile were placed, and the mixture was stirred while cooling on an ice water bath. To this mixture, 36.4 g (0.36 mol) of triethylamine was added dropwise from the dropping funnel over about 1 hour. After the completion of dropwise addition, the ice water bath was removed and the mixture was stirred at room temperature for 30 minutes.

To this reaction mixture, 51.7 g (0.30 mol) of p-aminobenzenesulfonamide was added, and the mixture was stirred for 1 hour while heating it at 70° C. in an oil bath. After the completion of reaction, this mixture was charged into 1 λ of water while stirring the water and the mixture obtained was stirred for 30 minutes. The resulting mixture was filtered and the precipitates were taken out and formed into a slurry with 500 ml of water. Subsequently, the slurry was filtered and the solid obtained was dried to obtain N-(p-aminosulfonylphenyl)methacrylamide as a white solid (yield: 46.9 g).

Thereafter, in a 100 ml-volume three-necked flask equipped with a stirrer, a condenser and a dropping funnel, 5.04 g (0.0210 mol) of N-(p-aminosulfonylphenyl)methacrylamide, 2.05 g (0.0180 mol) of ethyl methacrylate, 1.11 g (0.021 mol) of acrylonitrile and 20 g of N,N-dimethylacetamide were placed, and the mixture was stirred while heating at 65° C. by a hot water bath. To this mixture, 0.15 g of "V-65" (produced by Wako Junyaku) was added, and the resulting mixture was stirred for 2 hours in a nitrogen stream while keeping the temperature at 65° C. To the reaction mixture obtained, a mixture containing 5.04 g of N-(p-aminosulfonyl)methacrylamide, 2.05 g of ethyl methacrylate, 1.11 g of acrylonitrile, 20 g of N,N-dimethylacetamide and 0.15 g of "V-65" was added dropwise from the dropping funnel over 2 hours. After the completion of dropwise addition, the mixture obtained was stirred at 65° C. for 2 hours. After the completion of reaction, 40 g of methanol was added to the mixture and after cooling it, the mixture obtained was charged into 2 λ of water while stirring the water. The mixture was stirred for 30 minutes and then the precipitate was taken out by the filtration and dried to obtain 15 g of a white solid (called Alkali-Soluble Polymer Compound 1). The weight average molecular weight (polystyrene basis) of this alkali-soluble polymer compound was measured by gel permeation chromatography and found to be 53,000.

(Preparation of Substrate (Support))

A 0.3 mm-thick aluminum sheet (constructive material 1050) was degreased by washing it with trichloroethylene, subjected to graining of the surface thereof using a nylon blush and a water suspension of 400-mesh purmicestone, and then thoroughly washed with water. This sheet was etched by dipping it in a 25% aqueous sodium hydroxide solution at 45° C. for 9 seconds, washed with water, dipped in 20% nitric acid for 20 seconds, and again washed with water. At this time, the etched amount on the grained surface was about 3 g/m². Thereafter, this sheet was d.c. anodized at a current density of 15 A/dm² in 7% sulfuric acid as the electrolytic solution to form an anodic oxidation film of 3 g/m², and then washed with water and dried.

The aluminum sheet obtained was treated with a 2.5 wt % aqueous solution of sodium silicate at 30° C. for 10 seconds, an undercoat solution shown below was coated thereon, and the coated film was dried at 80° C. for 15 seconds to obtain a substrate (support). The coverage of the coated film after the drying was 15 mg/m².

| <Undercoat Solution> | |
|---|---|
| Copolymer having a molecular weight of 28,000 shown below | 0.3 g |
| Methanol | 100 g |
| Water | 1 g |

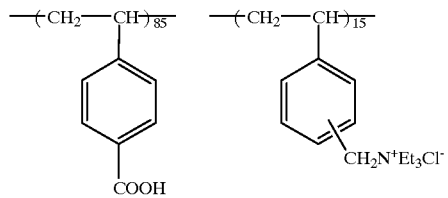

(Coating)

On the substrate obtained, Coating Solution 1 for forming a photosensitive layer shown below was coated to have a coated amount of 1.8 g/m². Thus, Lithographic Printing Original Plate Sample 1 was obtained.

| <Coating Solution 1 for forming Photosensitive Layer> | |
|---|---|
| Alkali-Soluble Polymer 1 [Component (A)] | 0.7 g |
| Cyanine Dye A [Component (B + C)] | 0.1 g |
| Phthalic acid anhydride [Component (D)] | 0.05 g |
| m,p-Cresol novolak (m/p ratio: 6/4, weight average molecular weight: 3,500, containing 0.5 wt % of unreacted cresol) | 0.01 g |
| 4-Diazo-3-methoxydiphenylamine $PF_6$ salt | 0.01 g |
| p-Toluenesulfonic acid | 0.002 g |
| Dye obtained by converting the counter ion of Victoria Pure Blue BOH into 1-naphthalene-sulfonic acid anion | 0.02 g |
| Fluorine-based surface active agent: Megafac F-177, produced by Dai-Nippon Ink & Chemicals, Inc.) | 0.05 g |
| γ-Butyrolactone | 8 g |
| Methyl ethyl ketone | 8 g |
| 1-Methoxy-2-propanol | 4 g |

[Exposure, Development and Evaluation]

Lithographic Printing Plate Original Plate Sample 1 obtained was stored at an ordinary temperature for 7 days after the preparation, then exposed using a semiconductor laser having an output of 500 mW, a wavelength of 830 nm and a beam diameter of 17 μm ($1/e^2$) at a main scanning rate of 5 m/sec, and subsequently developed using a developing apparatus and an alkali development processing solution both shown below. Thereafter, the image forming property of the developed sample was evaluated. The evaluation was performed by observing the quality of thin lines drawn and the residual film (revealing deficient solubility) with an eye.

(Preparation of Alkali Development Processing Solution)

The alkali development processing solution used in the development processing step was prepared as follows.

| <Formulation of Alkali Development Processing Solution> | |
|---|---|
| Potassium hydroxide | 2.4 wt % |
| Silicon dioxide | 1.8 wt % |
| Nonionic surface active agent (PEG-1000, produced by Wako Junyaku) | 0.8 wt % |
| Potassium citrate | 3.0 wt % |
| Water | 92.0 wt % |

The developer had a pH of 13.03 and an electroconductivity of 49,500 μs/cm.

(Developing Apparatus)

The development processing apparatus used except for Examples II-4 to II-6 was a commercially available development processing apparatus for PS plates, to which an electrolytic device shown in FIG. 1 with a control part (16 in FIG. 1) was connected. This development processing apparatus had a developing tank, a water washing tank and a desensitization treatment tank each in a dipping-in-bath system, in which the processing time in respective steps was 15 seconds, 10 seconds and 10 seconds in the order described above. The structure was designed to allow a part of the developer in the developing tank to be refluxed into the cathode chamber of the electrolytic cell.

Example II-1

In this Example, the degree of exhaustion of the developer due to the development processing was obtained by the processed amount in the development determined by the development processed amount-integrating unit furnished to the development processing apparatus.

The entire system was designed such that a voltage was applied to the electrodes based on the signals sent from the control part (16 in FIG. 1) appending to the electrolytic cell every each time when 3 $m^2$ (varied depending on the kind of the photosensitive resin composition) of Printing Original Plate Sample 1 was developed, to perform electrolysis at a current density of 5 $A/dm^2$ and a current value of 15 A for 2 minutes (quantity of current-carrying: 1,800 coulomb) and then the circuit was closed.

Every each time when development of 15 $m^2$ was performed in this apparatus, the developed sample for evaluation was taken out. The development processing was performed until the total processed amount reached 60 $m^2$.

The image forming property of the developed sample was evaluated with an eye, then, good results were obtained from the start of the development through the end in both the quality of fine lines drawn and the presence or absence of the residual film. Moreover, precipitates were not observed in the developer which was used in circulation while passing through the activation by electrolysis.

Example II-2

In this Example, the degree of exhaustion of the developer in the intervals where the development processing apparatus was in the dead time was obtained by the integrated dead intervals determined by the dead time-integrating unit furnished to the development processing apparatus, and the control of developer was performed by the electrolytic device based on the value obtained.

The development processing apparatus was turned off and laid in the dead state for 2 days without performing the development of a PS plate sample The entire system was designed such that a voltage was applied to the electrodes based on the signals sent from the control part (16 in FIG. 1) appending to the electrolytic cell every each time when the dead interval reached 5 hours, to perform electrolysis at a current density of 5 $A/dm^2$ and a current value of 15 A for 2 minutes (quantity of current-carrying: 1,800 coulomb) and then the circuit was closed.

After developing Original Plate Sample 1 as a control, the apparatus was left in the dead state for 2 days. Thereafter, without newly adjusting the developer in the developing tank, Original Plate Sample 1 of the same lot was immediately developed. These two samples were compared.

Both samples revealed good results in the valuation with an eye and there was no difference therebetween.

Example II-3

In this Example, the degree of exhaustion of the developer due to the development processing was obtained by the electroconductivity value of developer determined by the electroconductivity meter furnished to the developing tank of the development processing apparatus.

The entire system was designed such that a Voltage was applied to the electrodes based on the signals sent from the control part (16 in FIG. 1) appending to the electrolytic cell every each time when the electroconductivity was changed (reduced) by 495 μs/cm along with the development of Original Plate Sample 1, to perform electrolysis at a current density of 5 $A/dm^2$ and a current value of 15 A for 2 minutes (quantity of current-carrying: 1,800 coulomb) and then the circuit was closed. During this operation, if the change in the electroconductivity was not recovered to 495 μs/cm or less of the electroconductivity of the initial developer, a voltage was automatically further applied every 2 minutes.

Every each time when development of 15 m² was performed in this apparatus, the developed sample for evaluation was taken out. The development processing was performed until the total processed amount reached 60 m².

Original Plate Sample 1 developed was evaluated, then, good results were obtained from the start of the development through the end and the image quality on the original plate sample was not deteriorated along with the continuous processing. Furthermore, precipitates were not observed in the developer which was used in circulation while passing through the activation by electrolysis.

Example II-4

In this Example, an embodiment of performing the development processing of a material having a photosensitive resin composition of the present invention using an apparatus where an electrolytic (current-carrying) device and a development processing device were integrated, is described.

Figure 4:
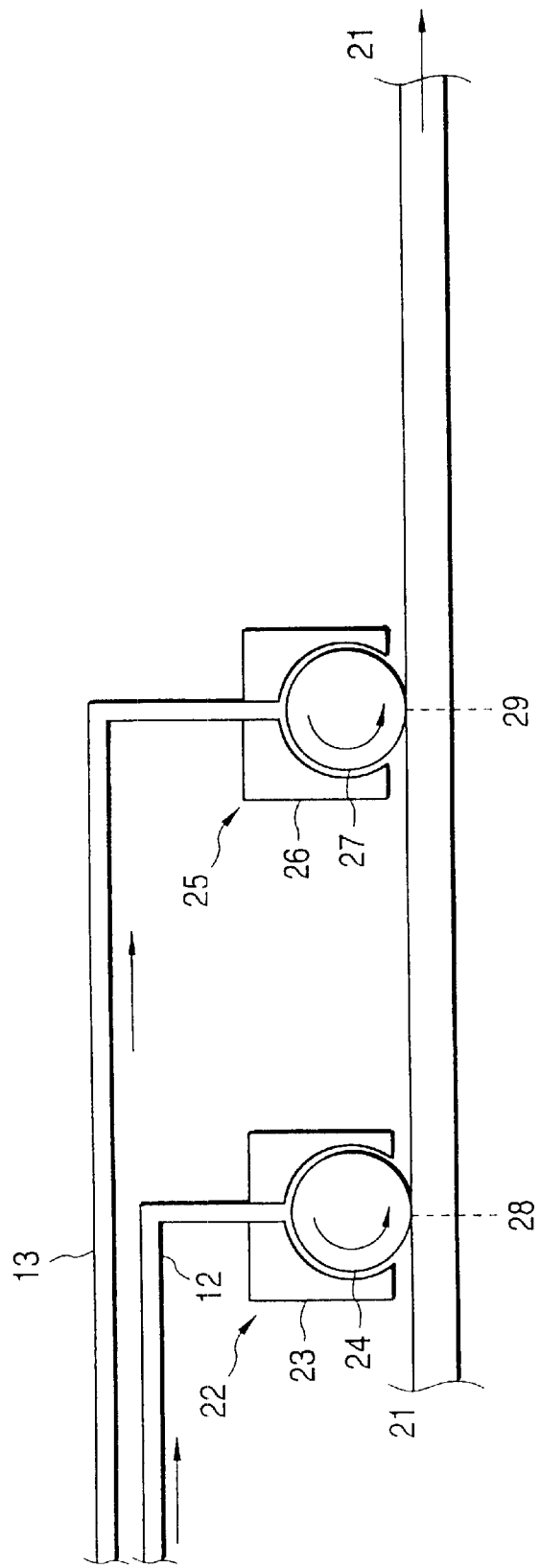
FIG. 4 is a schematic view showing a development processing apparatus where an electrolytic device is integrated, for use in another embodiment of the present invention.
Figure 5:
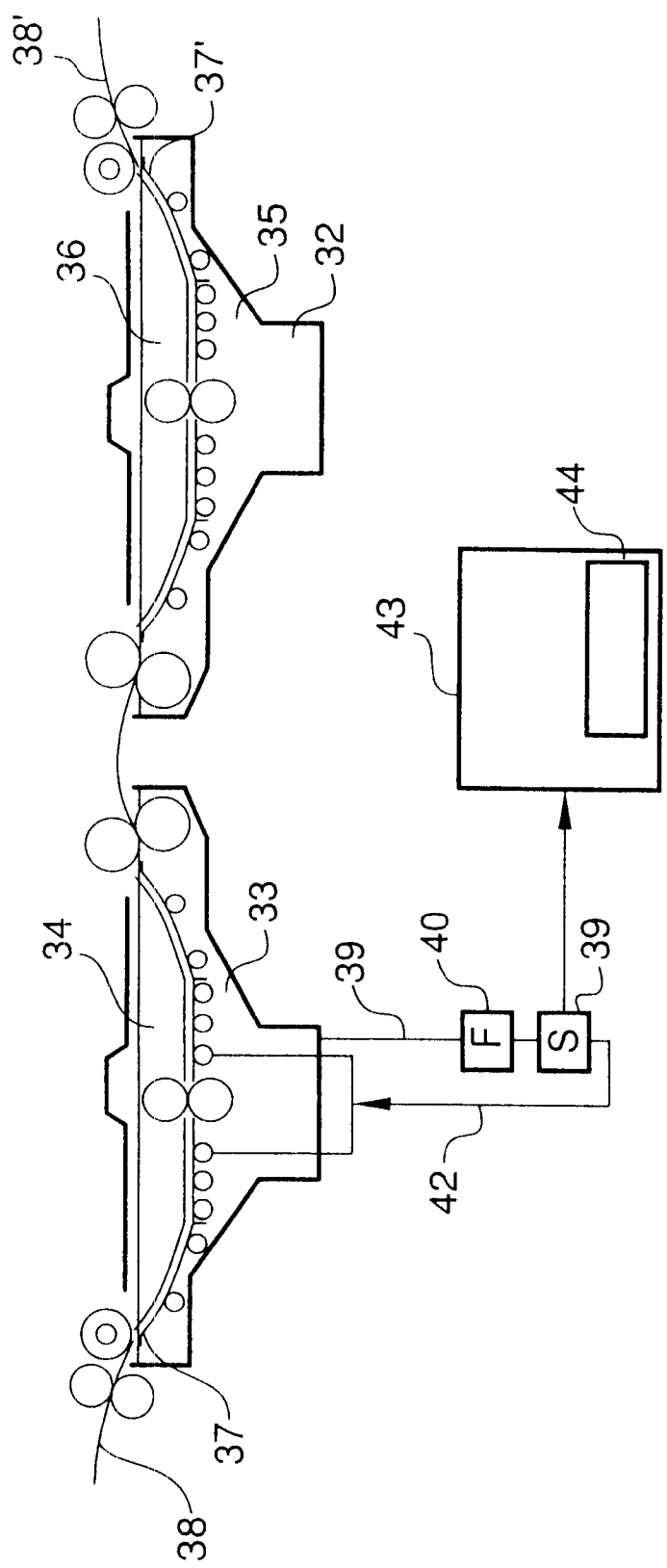
FIG. 5 is a schematic view showing a development processing apparatus where an electrolytic device is integrated, for use in still another embodiment of the invention.

FIG. 2 is a view showing an apparatus for use in the present invention, where an electrolytic device and a development processing device are integrated. In FIGS. 1, 4 and 5, the same number is used for the same part. The cathode chamber 4 of the electrolytic unit 2 concurrently serves as a development processing tank. The structure is designed such that the developer filled in the tank is at the same time a cathode solution and takes part in the reaction of producing hydroxy ion as a result of reduction of water by the cathode 15 while developing the photosensitive resin composition under transportation through the transportation route shown by the arrow A–A', so that the consumption of hydroxy ion due to the development can be compensated for by the production in the cathode. The anode chamber 3 is separated from the cathode chamber by the diaphragm 5 and the cathode solution flows over the upper portion of the diaphragm playing a weir into the anode chamber and is oxidized by electrolysis. As a result, electrolytic oxidation of organic components and generation of hydrogen ion take place and in turn the pH decreases. The anode solution is discharged as a development waste solution from the electrolytic unit through the discharge port 45. On the other hand, the developer in the cathode chamber 4 is circulated with stirring through the circulation route 41 by the circulating pump 40, whereby the temperature is controlled and the developer is stirred.

In this Example, Original Plate Sample 1 was developed in the same manner as in the development processing of Example II-3 except for using the apparatus shown in FIG. 2. Every each time when development of 15 m² was performed in this apparatus, the developed sample for evaluation was taken out. The development processing was performed until the total processed amount reached 60 m². The developed original plate was evaluated with an eye, then, good results were obtained from the start of the development through the end and precipitates were not observed in the developer which was used in circulation.

Example II-5

In this Example, an example of applying the development processing method for lithographic printing original plates of the present invention to the application development (also called coating development) and at the same time using the hydrogen ion produced in the anode chamber in the water washing.stopping step is described. FIG. 4 is a schematic view showing only the development processing part of an application developing apparatus according to the embodiment of the present invention. The processing web 21 is provided to transport an original plate to be developed. The original plate sample 1 is transported on the web 21 in the direction, in FIG. 4, from the left to the right and applied with a developer at the point 28 of contact with an applicator roller 24 integrated into the developer applying part 22. The applied thickness is set by controlling the distance between the lower end surface of the jacket 23 and the original plate. In this Example, the thickness was set to 0.5 mm. The development time is 15 seconds where the original plate sample moves from the contact point 28 for applying the developer to the contact point 29 for applying washing.stopping solution. The lower end face of the jacket 26 of the washing.stopping solution applying part 25 forms a squeegee blade for removing the applied solution and the applied developer on the original plate is removed by the squeegee blade. The used developer thus removed is returned to the electrolytic cell through a return line (not shown) and then transferred to the cathode chamber. The original plate sample 1 passed through the squeegee blade is applied with a washing.stopping solution at the point 29 of contact with an applicator roller 27 integrated into the washing.stopping solution applying part 25. The applied thickness is set by controlling the distance between the lower end surface of the jacket 26 and the original plate. In this Example, the thickness was set to 0.5 mm. The original plate sample 1 is further transported on the web for 20 seconds and the washing.stopping solution is removed by the squeegee, thereby finishing the development processing. The developer is fed to the developer applying part 22 from the cathode chamber of the electrolytic cell (not shown) through a liquid transfer line 12 and the washing.stopping solution is fed to the washing.stopping solution applying part 25 from the anode chamber (not shown) through a liquid transfer line 13. The electrolytic cell has a structure described in FIG. 1. The returned developer from the squeegee blade at the lower end of the jacket 26 of the washing.stopping solution applying part 25 shown in FIG. 4 and a newly prepared fresh developer (cell 6 in FIG. 1) are mixed, transferred to the cathode chamber 4, electrified and then transferred to the developing apparatus shown in FIG. 4 through the liquid transfer line 12. The anode solution is an aqueous solution containing 0.5 wt % of Glauber's salt, 0.5 wt % of sodium bicarbonate and 0.1 wt % of glacial acetic acid, which is electrified in the anode chamber 8 in FIG. 1 and then transferred to the washing.stopping solution applying part 5 of the developing apparatus shown in FIG. 4 through a liquid transferring line 13. This anode solution is applied to the original plate sample 1 at the contact point 29, then used for washing and discharged as a development waste solution from the electrolytic device.

In this Example, Original Plate Sample 1 was developed in the same manner as in the development processing of Example II-3 except for using the apparatus shown in FIG. 4. Every each time when development of 15 m² was performed in this apparatus, the developed sample for evaluation was taken out. The development processing was performed until the total processed amount reached 60 m². The developed original plate sample maintained good image forming property from the start of the development through the end and precipitation of components dissolved in the developer was not observed.

Example II-6

In this Example, an embodiment of applying the development processing method for lithographic printing original plates of the present invention to the slit development is described. FIG. 5 is a schematic view showing the structure of a slit developing apparatus using the processing by the passing of a current through the developer according to the present invention. The original plate sample is transported along the route 38–38'. In the developing tank 33, the route for transporting the developed sample is formed like a slit from the inlet 37 using a group of transportation rollers, opposing rollers for driving and a liquid cover 34. The original plate developed on passing through the slit-like route is subsequently transported to the washing.stopping part 35 having almost the same structure as the developing tank 33. In the washing.stopping part 35, the transportation route is also formed like a slit using a group of transportation rollers, drive rollers and a liquid cover 36 and the developed original plate is delivered from an outlet 37' outside the developing apparatus. The developer is circulated through a circulation route 42 and in the circulation route, a circulating pump 40 having integrated therein a filter for removing precipitates which may be generated during the development, and a cock 39 for the changing over to a control part 43 are provided. The changeover cock 39 works at different time intervals during the dead time and the development processing by the timer control to transfer the circulating solution to the control part 43 through the circulation route 42. In the control part 43, an electrolytic device 44 is integrated, where the developer introduced into the cathode chamber is returned when the electroconductivity thereof is recovered to a predetermined value, and comes into the developing tank 33 through the circulation route 42 from the changeover cock 39. As such, the developer in the developing tank is circulated from the developing tank 33 through the circulation route 42 and during this circulation, the temperature is controlled. At the same time, the developer is transferred to the control part 43 according to a program and the electroconductivity is maintained constant When the amount of developer in the developing tank is reduced, a fresh solution is replenished from a replenishing device (not shown) and thereby the liquid level can be maintained constant. In the embodiment of this Example, water washing is performed in the washing.stopping tank 35 by supplying washing water independently from the anode solution of the electrolytic device 44. In each of the developing tank 33 and the washing.stopping tank 35, the liquid volume in the tank is sufficiently large, however, by narrowing down the original plate-transporting route like a slit using transportation rollers and liquid cover as described above, the stirring effect is increased.

In this Example, Original Plate Sample 1 was developed in the same manner as in the development processing of Example II-3 except for using the apparatus shown in FIG. 4. Every each time when development of 15 m² was performed in this apparatus, the developed sample for evaluation was taken out. The development processing was performed until the total processed amount reached 60 m². The developed Original Plate Sample 1 maintained good image forming property from the start of the development through the end and precipitation of components dissolved in the developer was not observed.

Example II-7

Photosensitive Lithographic Printing Original Plate Sample 2 was prepared by changing the coating solution for forming the photosensitive layer of Photosensitive Lithographic Printing Original Plate Sample 1 in Example II-1 to Coating Solution 2 shown below and not changing other conditions. The exposure, development and evaluation were performed in the same manner as in Example II-1 except for using Original Plate Sample 2 prepared.

In this Example performed by changing the original plate sample, the developed Original Plate Sample 2 maintained good image forming property from the start of the development through the end and precipitation of components dissolved in the developer was not observed.

| <Coating Solution 2 for forming Photosensitive Layer> | |
|---|---|
| m,p-Cresol novolak [Component (A)] (m/p ratio: 6/4, weight average molecular weight: 8,000, containing 0.5 wt % of unreacted cresol) | 1.0 g |
| Cyanine Dye A [Component (B + C)] | 0.1 g |
| Phthalic Acid Anhydride [Component (D)] | 0.05 g |
| p-Toluenesulfonic acid | 0.002 g |
| Dye obtained by converting the counter ion of Ethyl Violet into 6-hydroxy-β-naphthalene-sulfonic acid | 0.02 g |
| Esterified product of naphthoquinone-1,2-diazide-5-sulfonyl chloride with pyrogallol-acetone resin | 0.01 g |
| Fluorine-based surface active agent: Megafac F-177, produced by Dai-Nippon Ink & Chemicals, Inc.) | 0.05 g |
| Methyl ethyl ketone | 8 g |
| 1-Methoxy-2-propanol | 4 g |

According to the developing method and the developing apparatus of the present invention, where the development is performed while maintaining the activity of developer by passing a current through the developer in the cathode chamber, a photosensitive lithographic printing original plate in the heat-mode image recording system having a problem in that fluctuation in the development conditions and the aging conditions of original plate appears by taking some forms in conventional developing methods, can be stably developed and used for the plate-making process using conventional processing apparatus and printing press while having a benefit that the direct plate-making from digital information such as computer can be performed.

Furthermore, according to the present invention, a method advantageous also in view of the environmental point and profitability such as reduction in the amount of development waste solution or in the development chemicals, can be provided.

While the invention has been described in detail and with reference to specific embodiments thereof, it will be apparent to one skilled in the art that various changes and modifications can be made therein without departing from the spirit and scope thereof.

What is claimed is:

1. A method for developing a material having a photosensitive resin composition, said method comprising developing a material having a plurality of photosensitive resin composition sheets in sequence with a developer, wherein the activity of developer is maintained by detecting the exhaustion of developer occurring with the development of said photosensitive resin composition and passing a current between two electrodes through a developer according to the degree of exhaustion detected.

2. The method for developing a material having a photosensitive resin composition as claimed in claim 1, said method comprising developing a material having a plurality of photosensitive resin composition sheets, wherein the activity of developer is maintained using a development processing apparatus comprising development means for processing said photosensitive resin composition with a developer, detection means for detecting the exhaustion of developer occurring with the development, means for passing a current between two electrodes through a developer and supply means for supplying hydroxy ion generated to the developer, by sequentially developing a plurality of photosensitive resin composition sheets with a developer, detecting the exhaustion of developer occurring with the development, and supplying hydroxy ion generated due to working of said means for passing a current, to the developer according to the degree of exhaustion detected.

3. The method for developing a material having a photosensitive resin composition as claimed in claim 1, wherein the means for detecting the exhaustion of developer occurring with the development is at least one selected from the following three means:
(1) reading of the processed area of the material having a photosensitive resin composition,
(2) integration of intervals where the development of the material having a photosensitive resin composition is not performed in the development processing apparatus, and
(3) measurement of the electric conductivity, specific gravity or opacity of the developer stored in the development processing apparatus.

4. The method for developing a material having a photosensitive resin composition as claimed in claim 1, wherein the exhaustion of developer occurring with the development is determined by combining (1) the reading of the processed area of the material having a photosensitive resin composition and (2) the integration of intervals where the development of the material having a photosensitive resin composition is not performed in the development processing apparatus.

5. The method for developing a material having a photosensitive resin composition as claimed in claim 1, wherein the development tank and the tank for passing a current between two electrodes through the developer are connected to each other by piping to constitute a circulatory system and the developer exhausted along with the development is reused after activating it by passing a current.

6. The method for developing a material having a photosensitive resin composition as claimed in claim 1, wherein the developer is an alkaline aqueous solution having a pH of 12.0 or more.

7. The method for developing a material having a photosensitive resin composition as claimed in claim 1, wherein the washing water used for the washing or stopping step subsequent to the development step is contacting with the anode and at the same time electrically contacting with the developer through a diaphragm.

8. The method for developing a material having a photosensitive resin composition as claimed in claim 1, wherein the diaphragm partitioning respective electrode chambers of two electrodes is a divalent selective anion exchange membrane.

9. A development processing apparatus for a material having a photosensitive resin composition, comprising development means for sequentially processing a material having a photosensitive resin composition with a developer, detection means for detecting the exhaustion of developer occurring with the development or the aging of developer, current-carrying means for passing a current between two electrodes through a developer to generate hydroxy ion, and circulation means for connecting said development means and said current-carrying means.

10. A method for developing a photosensitive lithographic printing plate precursor, comprising developing a lithographic printing plate precursor with an alkaline developer, said lithographic printing plate precursor comprising a support having thereon a photosensitive layer formed by coating an infrared laser use positive photosensitive composition containing at least (A) an alkali-soluble polymer compound, (B) a compound which compatibilizes with said alkali-soluble polymer compound to reduce the solubility of said polymer compound in an alkali aqueous solution and diminish the action of reducing said solubility on heating and (C) a compound which absorbs light and thereby generates heat, wherein the activity of said developer is maintained by passing a current between electrodes of current-carrying means appending to development means and having a cathode chamber, an anode chamber and electrodes, through the developer in the cathode chamber.

11. The method for developing a photosensitive lithographic printing plate precursor as claimed in claim 10, wherein the photosensitive lithographic printing plate precursor is a lithographic printing plate precursor having a photosensitive layer containing, in addition to said constituent components (A), (B) and (C), (D) a cyclic acid anhydride represented by the following formula (I):

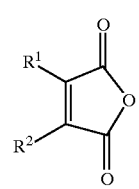

wherein $R^1$ and $R^2$ each independently represents hydrogen atom or an alkyl, alkenyl, alkoxy, cycloalkyl, aryl, carbonyl, carboxy or carboxylic acid ester group having from 1 to 12 carbon atoms, which may have a substituent, and $R^1$ and $R^2$ may be combined with each other to form a ring structure.

12. The method for developing a photosensitive lithographic printing plate precursor as claimed in claim 10, wherein the activity of developer is maintained by controlling the quantity of current passed between electrodes through the developer in the cathode chamber according to the degree of exhaustion of the developer occurring with the development and thereby controlling the production of hydroxy ion supplied to the developer.

13. The method for developing a photosensitive lithographic printing plate precursor as claimed in claim 10, wherein the means for detecting the exhaustion of developer occurring with the development is at least one selected from the following three means:
(1) reading of the processed area of the photosensitive lithographic printing plate precursor,
(2) integration of intervals where the development of the photosensitive lithographic printing plate precursor is not performed in the development processing apparatus, and
(3) measurement of the electric conductivity, specific gravity or opacity of the developer stored in the development processing apparatus.

14. The method for developing a photosensitive lithographic printing plate precursor as claimed in claim 10, wherein the anode solution taken out from the anode chamber of the current-carrying means forms a part or the whole of the washing water used for the washing or stopping step subsequent to the development step.

15. A development processing apparatus for photosensitive lithographic printing plate precursors, comprising:

development means for developing a photosensitive lithographic printing plate precursor, detection means for detecting the exhaustion of developer occurring with the development or the aging of developer, current-carrying means appending to the development means and having a cathode chamber and an anode chamber, for passing a current between electrodes through the developer in the cathode chamber to generate hydroxy ion, and liquid transfer means for connecting said development means and said current-carrying means.

16. A development processing apparatus for photosensitive lithographic printing plate precursors, comprising:

development means for developing a photosensitive lithographic printing plate precursor, washing or stopping means for stopping or washing said printing plate precursor delivered from the development step, detection means for detecting the exhaustion of developer occurring with the development or the aging of developer, current-carrying means appending to the development means and having a cathode chamber and an anode chamber, for passing a current between electrodes through the developer in the cathode chamber to generate hydroxy ion in the cathode chamber and at the same time generate hydrogen ion in the anode chamber, liquid transfer means for connecting said development means and said current-carrying means, and liquid transfer means for connecting said washing or stopping means and said current-carrying means.

* * * * *